United States Patent
Bayramian et al.

(10) Patent No.: US 8,483,255 B2
(45) Date of Patent: Jul. 9, 2013

(54) TRANSVERSE PUMPED LASER AMPLIFIER ARCHITECTURE

(75) Inventors: Andrew James Bayramian, Manteca, CA (US); Kenneth Manes, Brentwood, CA (US); Robert Deri, Pleasanton, CA (US); Al Erlandson, Livermore, CA (US); John Caird, San Francisco, CA (US); Mary Spaeth, Brentwood, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 308 days.

(21) Appl. No.: 12/940,869

(22) Filed: Nov. 5, 2010

(65) Prior Publication Data

US 2012/0114008 A1 May 10, 2012

(51) Int. Cl.
*H01S 3/20* (2006.01)
*H01S 3/08* (2006.01)

(52) U.S. Cl.
USPC ............................................. 372/99; 372/54

(58) Field of Classification Search
USPC .................................. 372/50.22, 54, 100, 99
See application file for complete search history.

(56) References Cited

U.S. PATENT DOCUMENTS

| | | | |
|---|---|---|---|
| 4,173,001 A * | 10/1979 | Frosch et al. | 372/71 |
| 4,430,291 A | 2/1984 | Chi | |
| 4,440,714 A | 4/1984 | Rose | |
| 4,663,110 A | 5/1987 | Cheng | |
| 4,698,198 A | 10/1987 | Gruen | |
| 5,160,696 A | 11/1992 | Bowman | |
| 5,285,310 A | 2/1994 | Miller et al. | |
| 5,390,211 A | 2/1995 | Clark et al. | |
| 5,434,873 A | 7/1995 | Delfyett, Jr. | |
| 6,614,826 B1 | 9/2003 | Bethel et al. | |
| 6,676,402 B1 | 1/2004 | Early et al. | |
| 6,904,069 B2 * | 6/2005 | Honea et al. | 372/31 |
| 6,970,493 B2 | 11/2005 | Henrie et al. | |
| 7,193,771 B1 * | 3/2007 | Smith et al. | 359/333 |
| 7,386,211 B1 | 6/2008 | Di Teodoro et al. | |
| 2002/0057754 A1 | 5/2002 | Stauffer et al. | |

(Continued)

FOREIGN PATENT DOCUMENTS

WO  WO 2009/058185 A2  5/2009

OTHER PUBLICATIONS

Rutherford et al., "An edge-pumped Yb:YAG slab laser and phased array resonator," Thesis (PhD). Stanford University, Source DAI-B 62/09, p. 4068, Mar. 2002, 120 pages.

(Continued)

*Primary Examiner* — Armando Rodriguez
(74) *Attorney, Agent, or Firm* — Kilpatrick Townsend & Stockton

(57) ABSTRACT

An optical gain architecture includes a pump source and a pump aperture. The architecture also includes a gain region including a gain element operable to amplify light at a laser wavelength. The gain region is characterized by a first side intersecting an optical path, a second side opposing the first side, a third side adjacent the first and second sides, and a fourth side opposing the third side. The architecture further includes a dichroic section disposed between the pump aperture and the first side of the gain region. The dichroic section is characterized by low reflectance at a pump wavelength and high reflectance at the laser wavelength. The architecture additionally includes a first cladding section proximate to the third side of the gain region and a second cladding section proximate to the fourth side of the gain region.

9 Claims, 16 Drawing Sheets

U.S. PATENT DOCUMENTS

2002/0110164 A1    8/2002    Vetrovec
2005/0157832 A1    7/2005    Nordberg et al.
2006/0002503 A1    1/2006    Ougouag et al.
2006/0072635 A1    4/2006    Wang
2006/0280217 A1    12/2006    Zervas et al.
2009/0059977 A1    3/2009    Hackel et al.
2009/0174930 A1    7/2009    McCahon et al.
2009/0296755 A1    12/2009    Brown et al.

OTHER PUBLICATIONS

Rutherford et al., "Edge-Pumped Quasi-Three-Level Slab Lasers: Design and Power Scaling," IEEE Journal of Quantum Electronics, Feb. 2000, 36(2):205-219.

Stappaerts et al., "Efficient, high-gain, 50-100 kW bulk-Yb laser," May 1999 [Publisher Information Unavailable], 10 pages.

* cited by examiner

Extraction laser

Extraction laser

TRANSVERSE PUMPED LASER AMPLIFIER ARCHITECTURE

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

Projections by the Energy Information Agency and current Intergovernmental Panel on Climate Change (IPCC) scenarios expect worldwide electric power demand to double from its current level of about 2 terawatts electrical power (TWe) to 4TWe by 2030, and could reach 8-10 TWe by 2100. They also expect that for the next 30 to 50 years, the bulk of the demand of electricity production will be provided by fossil fuels, typically coal and natural gas. Coal supplies 41% of the world's electric energy today, and is expected to supply 45% by 2030. In addition, the most recent report from the IPCC has placed the likelihood that man-made sources of $CO_2$ emissions into the atmosphere are having a significant effect on the climate of planet earth at 90%. "Business as usual" baseline scenarios show that $CO_2$ emissions could be almost two and a half times the current level by 2050. More than ever before, new technologies and alternative sources of energy are essential to meet the increasing energy demand in both the developed and the developing worlds, while attempting to stabilize and reduce the concentration of $CO_2$ in the atmosphere and mitigate the concomitant climate change.

Nuclear energy, a non-carbon emitting energy source, has been a key component of the world's energy production since the 1950's, and currently accounts for about 16% of the world's electricity production, a fraction that could—in principle—be increased. Several factors, however, make its long-term sustainability difficult. These concerns include the risk of proliferation of nuclear materials and technologies resulting from the nuclear fuel cycle; the generation of long-lived radioactive nuclear waste requiring burial in deep geological repositories; the current reliance on the once through, open nuclear fuel cycle; and the availability of low cost, low carbon footprint uranium ore. In the United States alone, nuclear reactors have already generated more than 55,000 metric tons (MT) of spent nuclear fuel (SNF). In the near future, we will have enough spent nuclear fuel to fill the Yucca Mountain geological waste repository to its legislated limit of 70,000 MT.

Fusion is an attractive energy option for future power generation, with two main approaches to fusion power plants now being developed. In a first approach, Inertial Confinement Fusion (ICF) uses lasers, heavy ion beams, or pulsed power to rapidly compress capsules containing a mixture of deuterium (D) and tritium (T). As the capsule radius decreases and the DT gas density and temperature increase, DT fusion reactions are initiated in a small spot in the center of the compressed capsule. These DT fusion reactions generate both alpha particles and 14.1 MeV neutrons. A fusion burn front propagates from the spot, generating significant energy gain. A second approach, Magnetic fusion energy (MFE) uses powerful magnetic fields to confine a DT plasma and to generate the conditions required to sustain a burning plasma and generate energy gain.

Important technology for ICF is being developed primarily at the National Ignition Facility (NIF) at Lawrence Livermore National Laboratory (LLNL), assignee of this invention, in Livermore, Calif. There, a laser-based inertial confinement fusion project designed to achieve thermonuclear fusion ignition and burn utilizes laser energies of 1 to 1.3 MJ. Fusion yields of the order of 10 to 20 MJ are expected. Fusion yields in excess of 200 MJ are expected to be required in central hot spot fusion geometry if fusion technology, by itself, were to be used for cost effective power generation. Thus, significant technical challenges remain to achieve an economy powered by pure inertial confinement fusion energy.

A diode pumped solid-state laser (DPSSL) is a laser that utilizes a solid gain medium, rather than a liquid gain medium, such as in dye lasers, or a gas gain medium, such as in gas lasers. DPSSLs are pumped using one or more diode lasers, also referred to as semiconductor lasers. Generally, the active medium of a DPSSL consists of a glass or crystalline host material that has been doped with a dopant such as neodymium, chromium, erbium, or another suitable ion. Ions of rare earth elements are common dopants for DPSSLs because the excited states of such ions are not strongly coupled with thermal vibrations of the crystalline lattice (phonons) and the lasing threshold can be reached at relatively low pump levels.

Neodymium-doped glass (Nd:glass) and ytterbium-doped glasses and ceramics are used in solid-state lasers at extremely high power (terawatt scale), high energy (megajoules) multiple beam systems for inertial confinement fusion. Titanium-doped sapphire is also widely used for its broad tunability. Diode-pumped solid-state lasers tend to be more efficient that flashlamp pumped systems and have become more common as the cost of high power semiconductor laser pumps has decreased.

Energy scaling and efficiency are important factors in the design and production of next generation diode pumped solid state lasers (DPSSLs). Over the last few decades, gas-cooled slab laser designs have emerged which allow high average power operation in large apertures. One of the difficulties with diode pumping is how to efficiently and homogeneously deliver diode light to the solid state amplifier. In the past, the slab amplifiers have been face-pumped, which creates a homogeneous pump profile, but requires expensive and inefficient diode light transport optics. A preferable technique is to make the diode light delivery system orthogonal to the extraction beam optics in a transverse pumped architecture. Diode light delivered to the edge of the slab will homogenize naturally as the incoherent and divergent diode light experiences total internal reflection inside the slab. However, aperture scaling leads to amplified spontaneous emission, a debilitating loss mechanism, which must be managed through the use of an absorbing perimeter around the slab. This absorbing perimeter typically absorbs diode light as well, which invalidates transverse pumping. The invention employs a geometric technique to manage the amplified spontaneous emission such that transverse pumping is possible along 1-axis. This technique could be employed in a wide variety of slab-like laser or amplifier architectures. A specific example benefiting high energy average power laser systems for inertial fusion energy drivers will be discussed.

SUMMARY OF THE INVENTION

According to the present invention, techniques related to optical systems are provided. More particularly, embodiments of the present invention relate to amplifier architectures suitable for transverse pumping of large aperture amplifier slabs. Merely by way of example, the invention has been applied to an amplifier architecture including a dichroic section operable to transmit pump light towards amplifier slabs while reflecting stray light from the amplifiers into absorbing cladding structures. The methods and systems described herein are also applicable to other optical systems suitable for use with amplifier and laser systems.

According to an embodiment of the present invention, an optical gain architecture is provided. The optical gain architecture includes a pump source operable to produce light at a pump wavelength along an optical path, a pump aperture operable to receive the light at the pump wavelength, and a gain region disposed along the optical path. The gain region includes a gain element operable to amplify light at a laser wavelength. The gain region is characterized by a first side intersecting the optical path, a second side opposing the first side, a third side adjacent the first and second sides, and a fourth side opposing the third side. The optical gain architecture also includes a dichroic section disposed between the pump aperture and the first side of the gain region. The dichroic section is characterized by low reflectance at the pump wavelength and high reflectance at the laser wavelength. The optical gain architecture further includes a first cladding section proximate to the third side of the gain region and a second cladding section proximate to the fourth side of the gain region.

According to another embodiment of the present invention, a method of operating an optical gain module is provided. The method includes directing pump light along a first optical path, passing the pump light through a first dichroic section, and absorbing a first portion of the pump light in a gain element. The method also includes directing input light along a second optical path intersecting the gain element, amplifying the input light using the gain element, and reflecting a second portion of the pump light toward the gain element using a second dichroic section. The method further includes reflecting amplified spontaneous emission emitted from the gain element from the first dichroic section and absorbing at least a portion of the reflected amplified spontaneous emission in a cladding region.

According to an alternative embodiment of the present invention, a laser amplifier system including a transverse pumped gain element is provided. The laser system includes a first cavity mirror and a second cavity mirror coupled to the first cavity mirror along an optical path. The laser system also includes a gain module disposed along the optical path. The gain module includes a pump source operable to provide pump light and a gain module optically coupled to the pump source and operable to absorb the pump light and amplify light at a laser wavelength. The gain module also includes a dichroic element operable to transmit at least a portion of the pump light and reflect at least a portion of the light at the laser wavelength and a cladding region partially surrounding the gain module and operable to absorb at least a portion of the light at the laser wavelength. The laser system further includes a switch disposed along the optical path and operable to reflect the light at the laser wavelength along an output path and a frequency conversion stage disposed along the output path.

Embodiments of the present invention are suitable for application in nuclear systems. Suitable nuclear systems include, but are not limited to, hybrid fusion-fission systems, a Laser Inertial-confinement Fusion Energy (LIFE) engine, hybrid LIFE systems such as a hybrid fusion-fission LIFE system, a generation IV reactor, an integral fast reactor, magnetic confinement fusion energy (MFE) systems, accelerator driven systems and others. In some embodiments, the nuclear system is a hybrid version of the Laser Inertial-confinement Fusion Energy (LIFE) engine, a hybrid fusion-fission LIFE system, such as described in International Patent Application No. PCT/US2008/011335, filed Mar. 30, 2008, titled "Control of a Laser Inertial Confinement Fusion-Fission Power Plant", the disclosure of which is hereby incorporated by reference in its entirety for all purposes.

Numerous benefits are achieved by way of the present invention over conventional techniques. For example, embodiments of the present invention provide methods and systems suitable for transverse pumping of high power amplifier slabs while absorbing stray light. Absorbing cladding layers are provided at some peripheral edges of the amplifier slabs while enabling the pump light to make multiple passes through the gain medium. According to embodiments of the present invention, pump light hardware is separable from the laser beam pathway when compared to an end pumped architecture. Transverse pumping reduces spatial nonuniformities in the diode array source. Embodiments of the present invention provide an architecture that is more flexible from an energetic standpoint since each gain slab is a complete individual unit and is separately pumped. As a result, an arbitrary number of gain slabs can be grouped together in a stack depending on system requirements. These and other embodiments of the invention along with many of its advantages and features are described in more detail in conjunction with the text below and attached figures.

DETAILED DESCRIPTION OF THE INVENTION

High power, large aperture DPSSL systems have many requirements that are often conflicting due to laser design parameters that are inseparable or inversely proportional. One of these design parameters is the technique to inject diode pump light into the gain slab. End pumping and face pumping techniques offer the advantage of being able to tailor the gain profile by tailoring the irradiance. However these methods are also prone to "imprinting" any unintended non-uniformities in the pump profile on the gain medium. These methods also require complex dichroic coatings that are subject to wavefront aberrations and low damage thresholds.

Edge pumping is another available technique suitable for use with DPSSLs. However, large aperture laser systems typically require an absorbing cladding around the periphery of the laser gain slab. This cladding is used to avoid parasitic lasing and decrease amplified spontaneous emission (ASE) in the transverse direction, which depletes the stored energy available for laser extraction. When pumping through this cladding, the absorption often extends into the pump wavelength bands, which lowers the pump transport efficiency and/or prevents efficient pumping by this method.

According to embodiments of the present invention, methods and systems are provided that enable transverse pumping (also referred to as edge pumping), which avoids issues associated with pump absorption in the cladding. At the same time, the methods and systems described herein provide the advantage that the pumping technique can be independently optimized relative to the extraction beam architecture. Embodiments of the present invention also include methods of gain profile shaping in the transverse pump architecture, which may provide a suitable wavefront and result in suitable laser extraction efficiency for various architectures. As described more fully throughout the present specification, gas cooled gain slabs with a large extraction aperture can be edge pumped and actively cooled for high average power applications.

Figure 1:
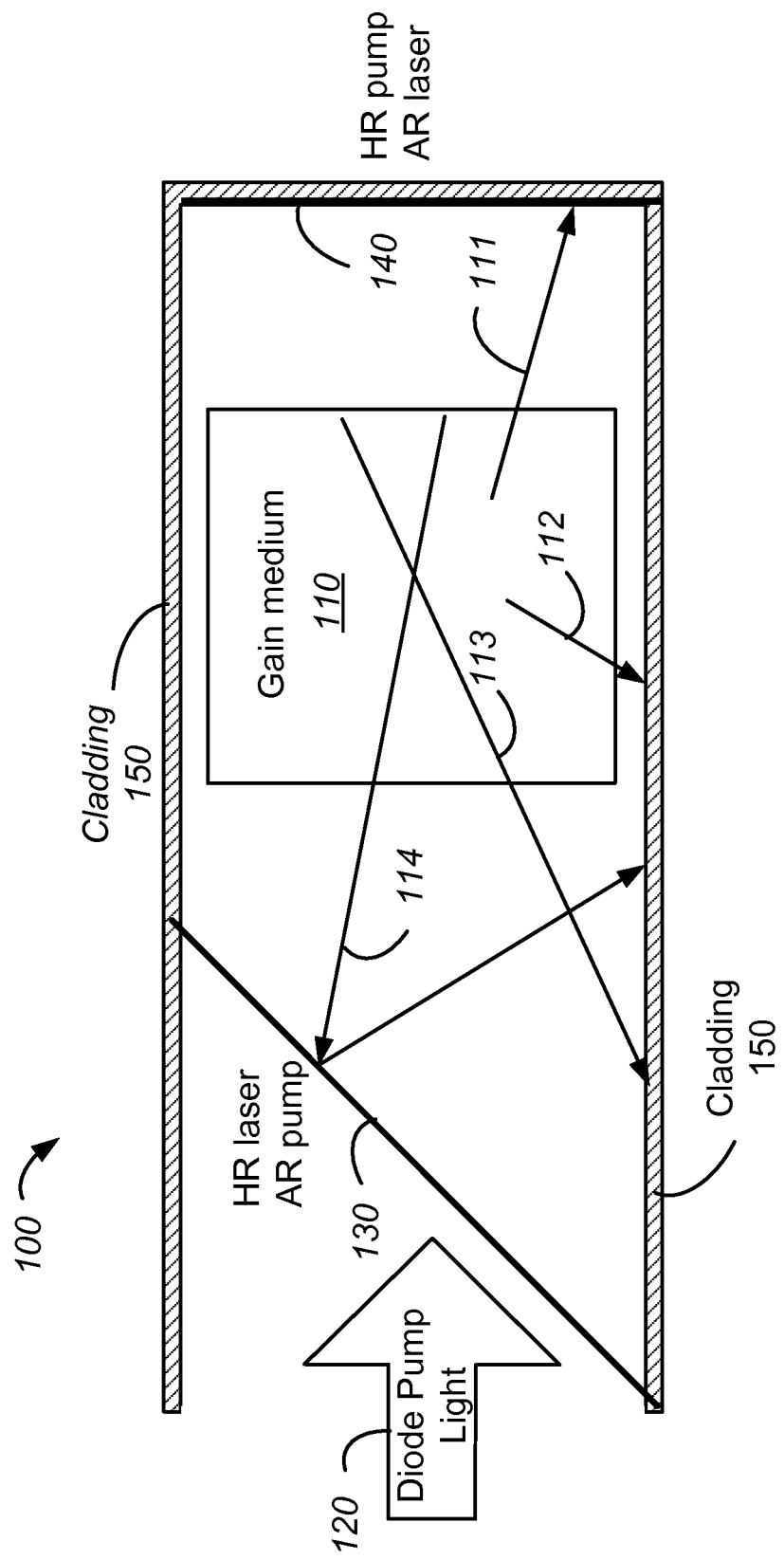
FIG. 1 is a simplified schematic diagram illustrating a transverse pumped laser architecture according to an embodiment of the present invention.

FIG. 1 is a simplified schematic diagram illustrating a transverse pumped laser architecture 100 according to an embodiment of the present invention. As described more fully throughout the present specification, embodiments of the present invention utilize an "unfolded" geometry in which the cladding around one side of the gain slab is unfolded or removed, allowing light (e.g., ASE) at the wavelength of the laser (i.e., extraction wavelength) to be absorbed by terminating in the cladding, while allowing light at the wavelength of the pump laser (i.e., pump wavelength) to be injected into the gain slab. The optical path of the amplified laser light (i.e., the extraction beam) is normal to the plane of the figure.

Referring to FIG. 1, a gain medium 110 is utilized to provide for gain in an amplifier or laser configuration. The gain medium 110 can be in the form of a gain slab, gain slablet, or the like. Depending on the particular implementation, the gain medium 110 will have various dimensions, for example, 27 cm×27 cm×1 cm in a particular slab implementation. Other dimensions are included within the scope of the present invention. The gain medium 110 can include one or more of various gain materials including Nd:Glass, Nd:YAG, Yb:SFAP, Yb:YAG, Yb:CaF$_2$, Yb:Glass, Er:YAG, Tm:YAG, or the like. These gain materials can exist in one or more forms including crystal, ceramic, or glass.

In order to pump the gain medium 110, pump light, for example, pump light from semiconductor lasers (i.e., diode pump light 120) is injected along an optical path to impinge on the gain medium 110. A dichroic structure 130 is provided that provides for high reflectivity at the laser wavelength (e.g., a high-reflection (HR) coating) and low reflectivity at the pump wavelength (e.g., an anti-reflection (AR) coating). This dichroic structure is illustrated by the HR laser and AR pump indicator adjacent dichroic structure 130. Thus, embodiments of the present invention utilize spectral differences by way of the dichroic structure. Additionally, embodiments of the present invention utilize angular spectrum differences in the pump light in comparison with the laser light. HR and AR are not intended to represent 100% and 0% reflectance, respectively, but are used to indicate a high and low reflectance respectively. As an example, AR coatings utilized according to embodiments of the present invention range in reflectance over a predetermined spectral bandwidth from <5%, <4%, <3%, <2%, <1%, <0.5%, <0.1%, <0.05%, or <0.01% depending on the particular implementation. Similarly, HR coatings utilized according to embodiments of the present invention range in reflectance over a predetermined spectral bandwidth from >95%, >96%, >97%, >98%, >99%, >99.5%, >99.9%, >99.95%, or >99.99% depending on the particular implementation. One of ordinary skill in the art would recognize many variations, modifications, and alternatives.

Referring to FIG. 1, the pump light can be delivered to the gain medium with a predetermined angular spread (e.g., <10 degree cone angle). In contrast with the low divergence pump light, the parasitic light, illustrated by example parasitic rays, propagates along all 4π steradians. While some laser propagation directions through the cavity experience minimal or no loss, upon reflection from one of the interfaces in the cavity, the rays are eventually redirected towards the cladding. The pump light, on the other hand, propagates with a narrow cone angle in comparison such that even a very tiny difference in refractive index between the gain medium and the surrounding material will result in waveguiding of the pump light inside the gain medium.

Referring to FIG. 1, diode pump light 120 passes through dichroic structure 130 to impinge on the gain medium 110. Pump light not absorbed in the gain medium is reflected by second dichroic structure 140 to impinge on the gain medium a second time. The second dichroic structure 140 can be a dichroic mirror. By providing for double-pass pumping of the gain medium, high pump absorption is achieved. In contrast, light at the laser wavelength propagating in the transverse pumped laser architecture is reflected toward the cladding by dichroic structure 130 (HR laser), strikes the cladding directly, or passes through second dichroic structure 140 to strike the cladding 150. The cladding 150 is fabricated from any suitable material that absorbs light at the laser wavelength. Thus, the cladding material and structure will be a function of the laser gain medium utilized in the system. As an example, the cladding can include materials (e.g., glass, YAG, SFAP, etc.) doped with quantum dots, samarium, chromium, cobalt, copper, other transition metals, combinations thereof, or the like. The material included in the cladding is preferably characterized by a broad absorption band at the laser wavelength.

ASE generated in the gain medium 110 is illustrated by exemplary parasitic rays 111, 112, 113, and 114 in FIG. 1. These ASE rays are merely illustrated for purposes of showing the manner in which the structure absorbs ASE and thereby limits gain reductions due to ASE. ASE ray 111 propagates towards and passes through the second dichroic structure 140 (AR at the laser wavelength) and is then absorbed by the cladding 150. ASE ray 112 exits the gain medium and impinges on the cladding where it is absorbed. ASE ray 113 propagates towards the pump aperture at an angle such that this parasitic ray strikes the cladding where it is absorbed prior to reaching the first dichroic structure 130. ASE ray 114 also propagates towards the pump aperture, but at an angle such that it strikes the first dichroic structure before reaching the cladding. ASE ray 114 is reflected from the first dichroic structure (HR at the laser wavelength) and then impinges on the cladding where it is absorbed. The geometry of the structure results in the ASE at many different angles to be either reflected by the first dichroic structure and then terminate at the cladding or to pass through the second dichroic structure to be absorbed by the cladding. Thus, ASE rays are able to terminate at the cladding before they have a chance to pass back through the gain medium. Embodiments of the present invention are applicable to numerous designs that reduce the impact of ASE for transversely pumped, large area gain medium operating at high average power.

Figure 2:
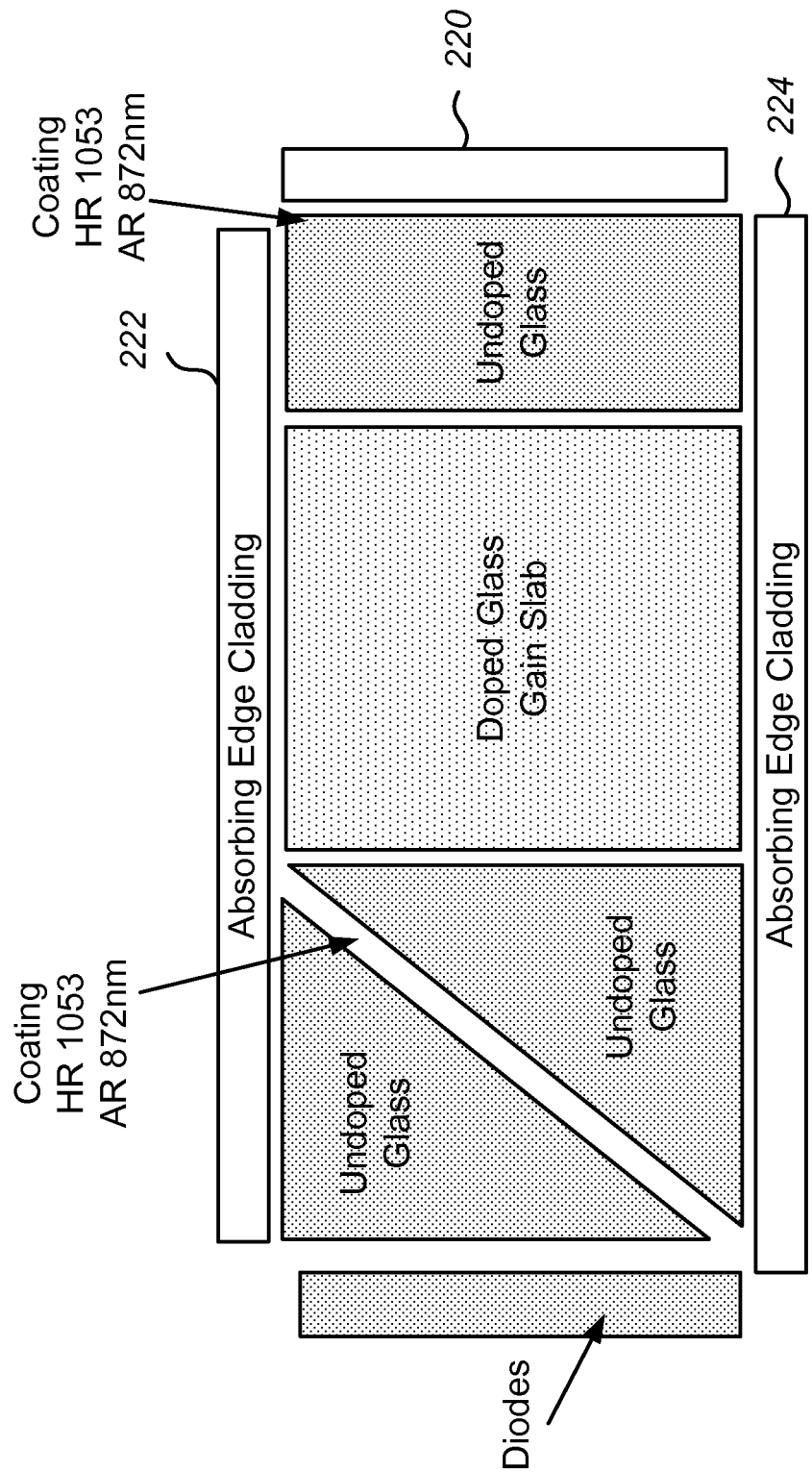
FIG. 2 is a simplified schematic diagram illustrating conceptual elements of the transverse pumped laser architecture shown in FIG. 1.

FIG. 2 is a simplified schematic diagram illustrating conceptual elements of the transverse pumped laser architecture shown in FIG. 1. As illustrated in FIG. 2, diode lasers (i.e., diodes) are provided as a pump source. Optics associated with collimation and beam shaping of the diode laser light are not illustrated for purposes of clarity. A set of undoped glass optics having shapes similar to prisms are provided with a coating (e.g., a multilayer dielectric coating) that is HR at 1053 nm (the laser wavelength) and AR at 872 nm (the pump wavelength). The HR coating is designed such that it provides for broad angular bandwidth at the laser wavelength and surrounding wavelengths associated with ASE. Pump light passes through the coating to impinge on the doped glass gain slab. Because the optical intensity passing through the undoped glass optics is relatively low, the undoped glass optics can be coated and then glued together with an optical adhesive so that a single optical element is formed. Thus, although FIG. 2 illustrates a gap between the two undoped glass optics, this is merely to illustrate components of the structure and is not required by embodiments of the present invention. One of ordinary skill in the art would recognize many variations, modifications, and alternatives.

A second undoped glass optic is provided on the side of the gain slab opposing the pump source. A coating that is AR at 1053 nm and HR at 872 nm is formed on the second undoped glass optic to pass any parasitic light at the laser wavelength to an absorbing edge cladding 220. Absorbing edge claddings 222 and 224 are also provided adjacent other surfaces of the gain slab (including surfaces parallel to the plane of the figure) to absorb parasitic light (e.g., amplified spontaneous emission). Parasitic light propagating back towards the pump source is reflected by the coating located at the interface between the undoped glass optics and directed toward the absorbing edge cladding. In an embodiment, the second undoped glass optic is replaced with a set of prism-shaped elements as shown on the side adjacent the pump source. One of ordinary skill in the art would recognize many variations, modifications, and alternatives.

Figure 3:
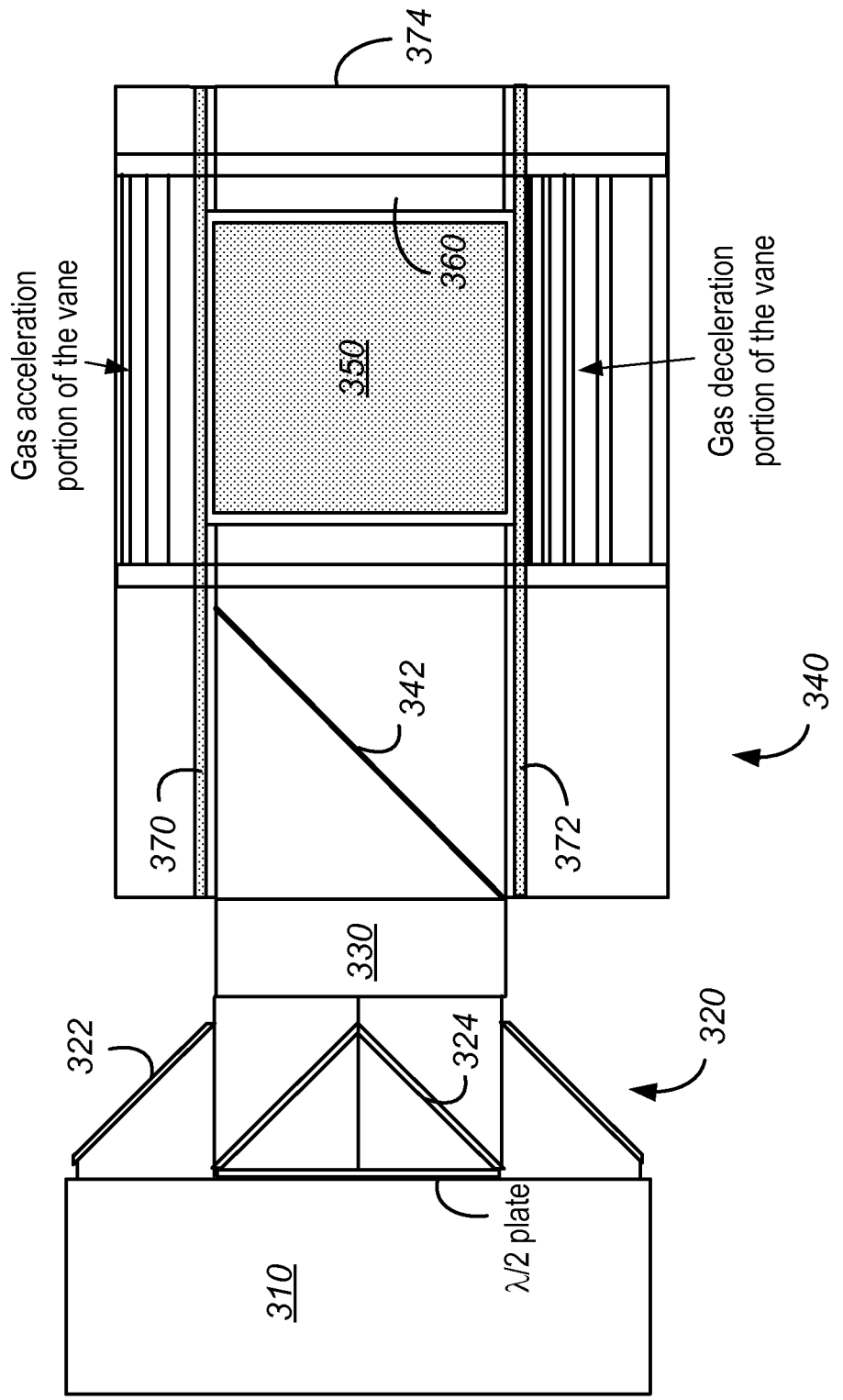
FIG. 3 is a simplified schematic diagram illustrating a transverse pumped amplifier module as a component of a high average power laser system according to an embodiment of the present invention.

Embodiments of the present invention are useful in a variety of applications including as a laser driver for inertial fusion energy. FIG. 3 is a simplified schematic diagram illustrating a transverse pumped amplifier module as a component of a high average power laser system according to an embodiment of the present invention. The emission from a diode array 310 is first brightness enhanced by a polarization multiplexing system 320, and then using an optical duct 330, the light is launched into the amplifier waveguide 340. The optical duct 330, as well as the structure of the amplifier waveguide 340 utilized total internal reflection (TIR) to improve the homogenization of the pump beam. The duct 330 and other elements can be wedged in or more directions as appropriate in order to direct the pump light into the gain medium with high efficiency. In addition to polarization multiplexing, spectral multiplexing can be utilized to increase the pump power. In the illustrated embodiment, a half-wave plate is utilized between the diode array 310 and the other elements of the polarization multiplexing system. In some embodiments, the optical duct 330 is a small optical duct that is wedged in thickness as a function of position, becoming thinner in the direction normal to the plane of the figure moving from the diode array toward the gain slab.

Merely by way of example, the optical duct 330 can be 4×25 cm$^2$ in dimension with the thickness wedged from about 2 cm to about 1 cm. In the polarization multiplexing system illustrated in FIG. 3, a coating 322 that is HR at 873 nm is oriented at 45 degrees to reflect the S-polarization of the pump light and polarizer 324 is then used to reflect this light a second time toward the amplifier waveguide. Although optical duct 330 and the amplifier waveguide 340 are illustrated as separate components in FIG. 3, this is not required by the present invention and these elements can be integrated as appropriate to the particular application. Additionally, the amplifier waveguide 340 can be tapered or wedged as discussed in relation to the optical duct 330 to increase the intensity of the pump light. One of ordinary skill in the art would recognize many variations, modifications, and alternatives.

The amplifier waveguide 340 is split by the laser rejection coating 342, which is low-loss (i.e., AR) for the incoming pump light. The laser rejection coating 342 is HR at 1053 nm for an arbitrary angle of incidence and polarization and AR at 873 for unpolarized light. Since dichroic coatings are characterized by varying reflectance as a function of angle, the HR coatings described herein are not required to provide a fixed reflectance as a function of angle and wavelength, but are expected to vary in reflectance. Thus, the term HR is not intended to limit these coatings to a particular reflectance level, but to provide an indication that light at the laser or pump wavelength is preferentially reflected as appropriate to the particular application. The pump light propagates via total internal reflection across the amplifier slab 350 with a large fraction of the light absorbed. The pump light then propagates along a short section of waveguide 360 and is then retro-reflected back through the amplifier slab a second time. The retro-reflection is provided by dichroic coating 374 that is AR at 1053 nm for an arbitrary angle of incidence and polarization and HR at 873 nm for the unpolarized pump light. Cladding layers 370 and 372 (as well as cladding layers parallel to the plane of the figures that are not shown), are provided to absorb the parasitic light. A Voranol potting or other suitable material can be used in the spaces or gaps between the optical elements including the amplifier slab and the cladding layers. Voranol potting is provided as an example of a material that can provide for joining of the cladding material to the gain medium. Because of the energy absorbed in the cladding, the inventors have determined that it is beneficial to separate the absorbing cladding from the gain medium in order to reduce thermal stresses. In addition to Voranol, other attachment mechanisms, including other flexible potting materials and optical glues can be used.

Figure 4A:
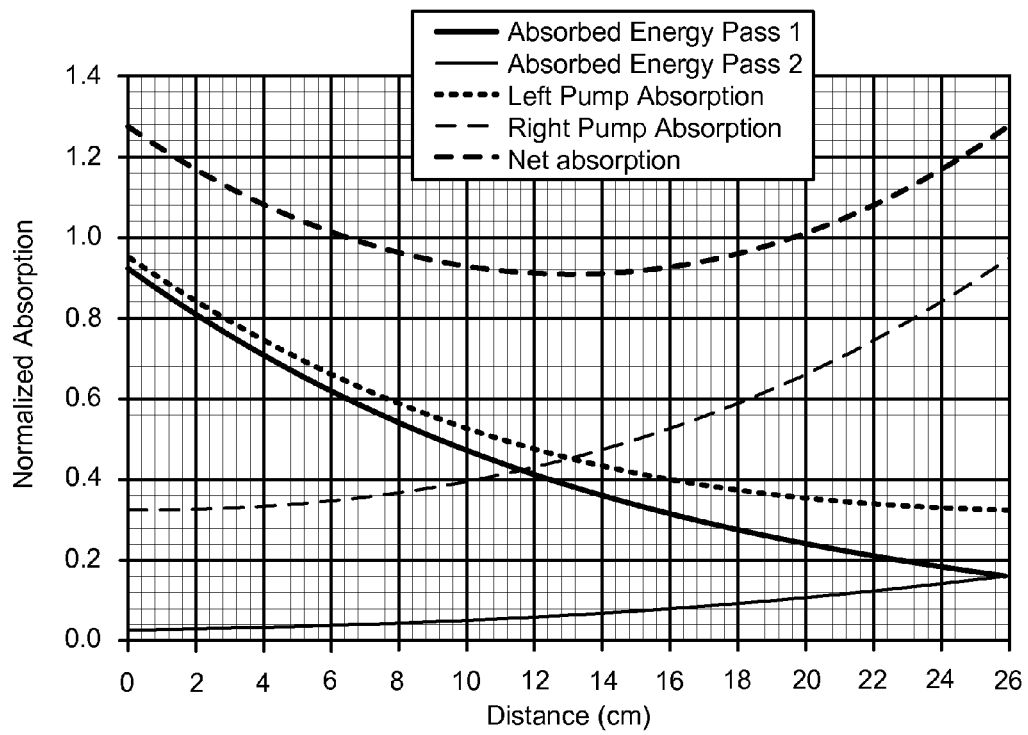
FIG. 4A is a simplified plot illustrating pump absorption profiles as a function of distance according to an embodiment of the present invention.

The double pass pump architecture illustrated in FIG. 3 provides for efficient absorption while, at the same time, minimizing gain variation across the amplifier slab. FIG. 4A is a simplified plot illustrating pump absorption profiles as a function of distance according to an embodiment of the present invention. For the data illustrated in FIG. 4A, the absorption coefficient is uniform as a function of position since the amplifier has undoped edges bonded to homogeneously doped amplifier slab. As illustrated in FIG. 4A, for pumping from a single side of the amplifier slab (Left Pump), there is a monotonic decrease in the effective gain across the aperture in the direction away from the pump source (e.g., the diode arrays). Pumping from both sides of the amplifier slab (Left+Right Pump) provides a more uniform effective gain profile across the aperture. In addition to bilateral pumping, combinations of right-hand and left-hand pumped amplifier slabs can be used to achieve reduced pump non-uniformity as a function of position. For the data illustrated in FIG. 4A, an absorption coefficient of 0.0756 cm$^{-1}$ was utilized, resulting in an absorption efficiency of 0.970.

According to some embodiments, the doping concentration is varied as a function of position to further reduce the gain variation illustrated in FIG. 4A. Additional description related to varying doping concentration is provided in FIGS. 11A-14B). Alternatively, the intensity profile of the pump light can be modified from a top-hat to a non-uniform design (for example, by design of the waveguides used for pump injection) such that the pump light absorption in the gain medium varies as function of position, further reducing the gain variation. Furthermore, the gain medium can be wedged as a function of position (e.g., thinner at the edge opposing the pump source or thicker at the edge opposing the pump source) to decrease or increase the cross section as a function of position as appropriate to the particular application and thereby increase the remaining pump intensity as a function of position to counteract the monotonic decrease in absorption illustrated in FIG. 4A.

Figure 4B:
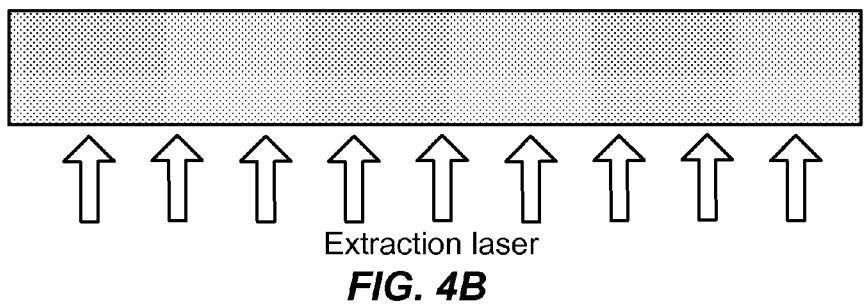
FIG. 4B is a simplified top-view diagram illustrating a gain slab architecture according to an embodiment of the present invention.
Figure 4C:
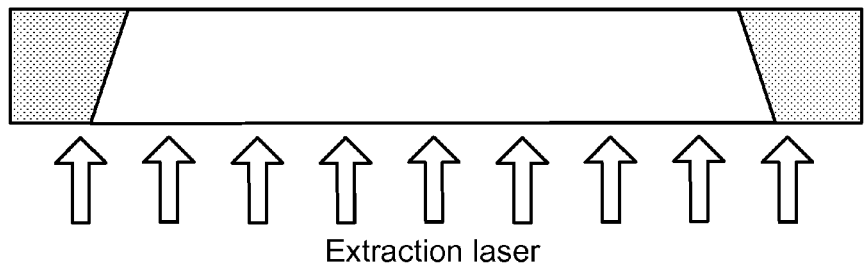
FIG. 4C is a simplified top-view diagram illustrating a gain slab architecture according to another embodiment of the present invention.

FIG. 4B is a simplified top-view diagram illustrating a gain slab architecture according to an embodiment of the present invention. In the gain slab illustrated in FIG. 4B, the extraction laser experiences uniform gain material as a function of position. FIG. 4C is a simplified top-view diagram illustrating a gain slab architecture according to another embodiment of the present invention. As illustrated in FIG. 4C, although the extraction laser has uniform intensity entering the gain slab, the gain profile is reduced at edge portions (illustrated by the shaded regions), partially or completely counteracting the gain profile with reduced central gain as illustrated in FIG. 4A (Left+Right Pump). In the architecture illustrated in FIG. 4C, the shaped gain profile provides a flatter extraction profile and allows for the extraction beam to completely overlap the gain region with reduced or no diffractive losses. In an exemplary embodiment providing the structure illustrated in FIG. 4C, multiple uniformly doped pieces, which may be easier to fabricate, are bonded together to make an assembly with an effective doping gradient, which can be equivalent to changing the doping concentration in the plane.

In order to improve system performance and efficiency, the design illustrated in FIG. 4C prevents the extraction laser beam aperture from touching the physical edge of the slab, thereby preventing diffraction effects that would impact downstream optics in the laser system. Likewise, the gain profile is provided with a graded transition to prevent similar diffraction effects. As a result, the extraction beam is sized to underfill the pumped aperture. One embodiment of the present invention cants the edges of the amplifier slab and bonds undoped material to the edges. This design provides a softer ramped gain profile at the edges of the aperture. This architecture would thus enable the extraction beam to completely overlap the amplifier, thereby eliminating loss due to underfilling the aperture.

Using embodiments of the present invention, parasitic laser light is trapped and terminated in the cladding as described above. The amplifier is thus efficiently pumped and efficiently stores the energy for extraction. To maintain adequate wavefront on the laser under high average power, some embodiments remove heat along the same direction as the extraction laser, thereby minimizing any thermal lensing in the system. As illustrated in FIG. 3, heat removal is accomplished by including an airfoil to accelerate gas over the surface of the amplifier slab 350. By alternating the pumping direction in multiple amplifier slabs from left to right, the gain profile and thermal wavefront can be further homogenized and symmetrized, with the number of slabs dependent on the particular laser operational requirements. In a particular laser design for inertial fusion energy drivers with laser amplifier apertures on the order of 25 cm, approximately 22 amplifier slabs are utilized (alternating left-right) grouped together into a single gas-cooled block.

According to some embodiments of the present invention, end pumping is combined with the transverse pumping architecture disclosed herein. As an example, end pumping can be used to reduce or eliminate gain variations as a function of position as illustrated in FIG. 4A. Since modifying the gain variations is performed at a level of a few percent of the transverse pumping, the intensity of the pump sources used for end pumping can be an order of magnitude less than the pump sources used for edge pumping. Therefore, system complexity typically associated with end pumping designs can be reduced significantly. The combinations of end pumping and edge pumping are therefore included within the scope of the present invention.

Figure 4D:
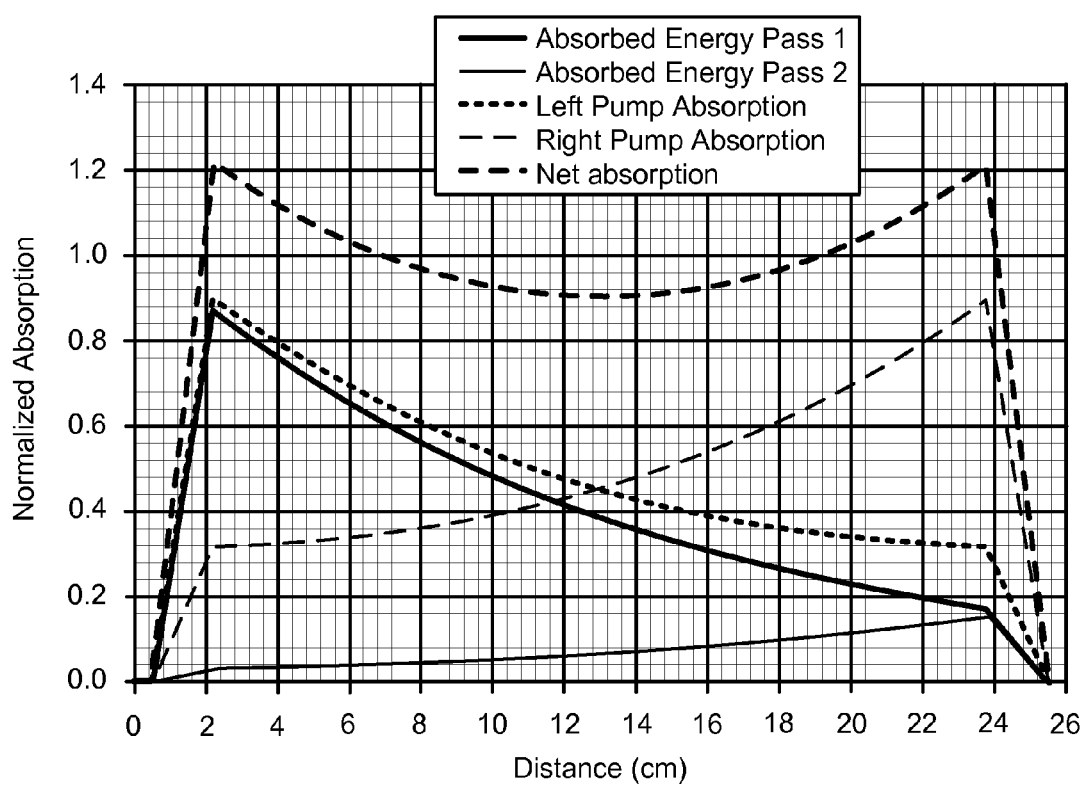
FIG. 4D is a simplified plot illustrating pump absorption profiles as a function of distance for the design illustrated in FIG. 4C according to an embodiment of the present invention.

FIG. 4D is a simplified plot illustrating pump absorption profiles as a function of distance for the design illustrated in FIG. 4C according to an embodiment of the present invention. To compute the values illustrated in FIG. 4D, the extraction beam size was set to the pump area. The beam hard clip was 25 cm with a modefill of 87% or a 23.3 cm beam FWHM.

Therefore, based on these inputs, the undoped border of the 26 cm transverse slab is 0.5 cm completely clear and then a linear gradient region 1.7 cm in width with doping funning from zero to 100%. For these conditions, the 50% doping point is 23.3 cm in width. For the data illustrated in FIG. 4D, an absorption coefficient of 0.0756 cm$^{-1}$ was utilized, resulting in an absorption efficiency of 0.970.

Since gain, in practice, is nonlinear, some embodiments of the present invention will utilize a gain profile to be wider than this example (i.e., a steeper gradient), however the essential features of embodiments of the present invention are illustrated by FIG. 4D. To reach the same absorbed power in the slab (which can be considered as nominally equivalent to gain), ~12% more energy will be provided from the pump source. The pump contrast goes from 22% to 27% for the case of identical net pump absorption of 97%.

Figure 5A:
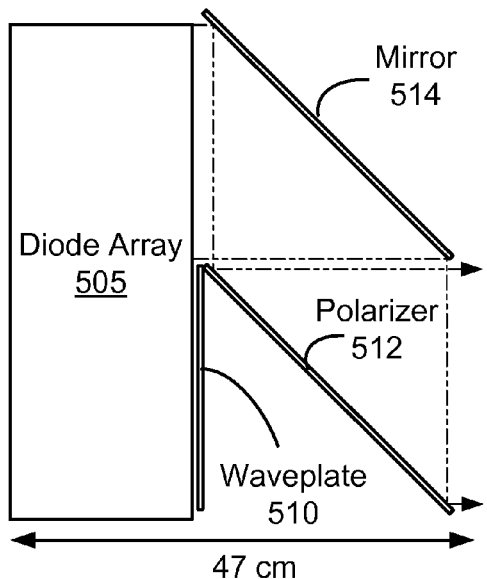
FIGS. 5A-5C are simplified schematic diagrams illustrating polarization combination architectures according to an embodiment of the present invention.
Figure 5B:
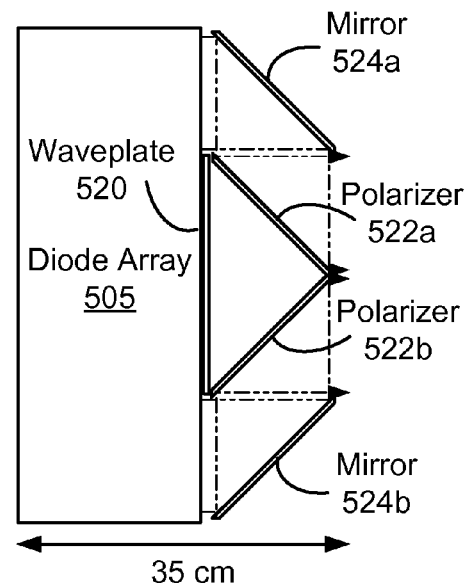
Figure 5C:
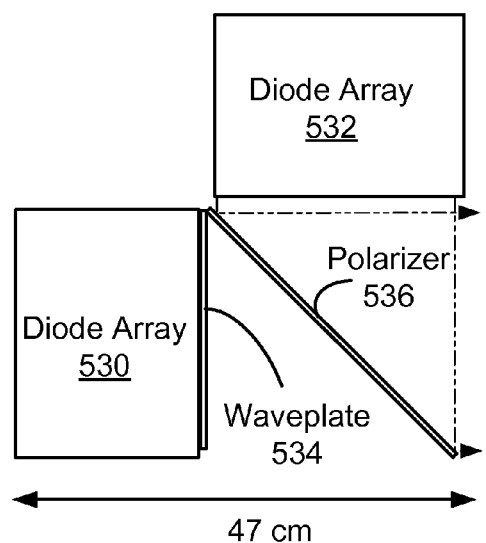

FIGS. 5A-5C are simplified schematic diagrams illustrating polarization combination architectures according to an embodiment of the present invention. As already discussed in relation to FIG. 3, polarization combining can be utilized to increase the pumping efficiency of the gain medium. Three different possible polarization combination architectures are illustrated in FIGS. 5A-5C. Embodiments of the present invention are not limited to these three architectures, but they are illustrated and described merely as examples of potential polarization combination architectures.

The first architecture illustrated in FIG. 5A includes a diode array 505. The light from the diode array is emitted in a beam having substantially a single, predetermined polarization state (e.g., s-polarization). The first architecture utilizes a large waveplate 510 (e.g., ~25×25 cm$^2$), a large polarizer 512 (e.g., ~25×35 cm$^2$), and a large mirror 514 (e.g., ~25×35 cm$^2$). The waveplate 510 (i.e., a half-wave plate) converts the polarization of light from the lower half of the diode array from a first polarization state (e.g., s-polarization) to a second polarization state (e.g., p-polarization).

The mirror 514 reflects the light from the top half of the diode array toward polarizer 512, which is aligned to reflect the first polarization state (e.g., s-polarization) and pass the second polarization state (e.g., p-polarization). Thus, the converted light from the lower half of the diode array passes though polarizer 512 while the light from the top half of the diode array is reflected from polarizer 512 toward the right hand side in the figure. In the embodiment illustrated in FIG. 5A, the length of the polarization combination architecture is 47 cm. Other dimensions are included within the scope of the present invention.

The second architecture illustrated in FIG. 5B includes a diode array 505. The first architecture utilizes a large waveplate 520 (e.g., ~25×25 cm$^2$), two polarizer 522a and 522b (e.g., ~25×17.6 cm$^2$), and two mirrors 524a and 524b (e.g., ~25×17.6 cm$^2$). In the illustrated embodiment, the light from the diode array is emitted in a beam having substantially a single, predetermined polarization state (e.g., s-polarization). The waveplate 520 (i.e., a half-wave plate) converts the polarization of light from the lower half of the diode array from a first polarization state (e.g., s-polarization) to a second polarization state (e.g., p-polarization).

The mirrors 524a and 524b reflect the light from the top quarter and bottom quarter of the diode array toward polarizers 522a and 522b, which are aligned to reflect the first polarization state (e.g., s-polarization) and pass the second polarization state (e.g., p-polarization). Thus, the converted light from the center half of the diode array passes though polarizers 522 and 522b while the light from the top quarter and bottom quarter of the diode array is reflected from polarizers 522a and 522b toward the right hand side in the figure.

In the embodiment illustrated in FIG. 5A, the length of the polarization combination architecture is reduced to 35 cm through the use of the smaller mirrors and polarizers. Other dimensions are included within the scope of the present invention.

The third architecture illustrated in FIG. 5C includes two diode arrays 530 and 532. The third architecture utilizes a large waveplate 534 (e.g., ~25×25 cm$^2$) and a large polarizer 536 (e.g., ~25×35 cm$^2$). In the illustrated embodiment, the light from the two diode arrays is emitted in beams having substantially a single, predetermined polarization state (e.g., s-polarization). The waveplate 534 (i.e., a half-wave plate) converts the polarization of light from diode array 530 from a first polarization state (e.g., s-polarization) to a second polarization state (e.g., p-polarization).

The polarizer 536 is aligned to reflect the first polarization state (e.g., s-polarization) and pass the second polarization state (e.g., p-polarization). Thus, the converted light from diode array 530 passes though polarizer 536 while the light from diode array 532 is reflected from polarizer 536 toward the right hand side in the figure. In the embodiment illustrated in FIG. 5A, the length of the polarization combination architecture is 47 cm. Other dimensions are included within the scope of the present invention.

Figure 6:
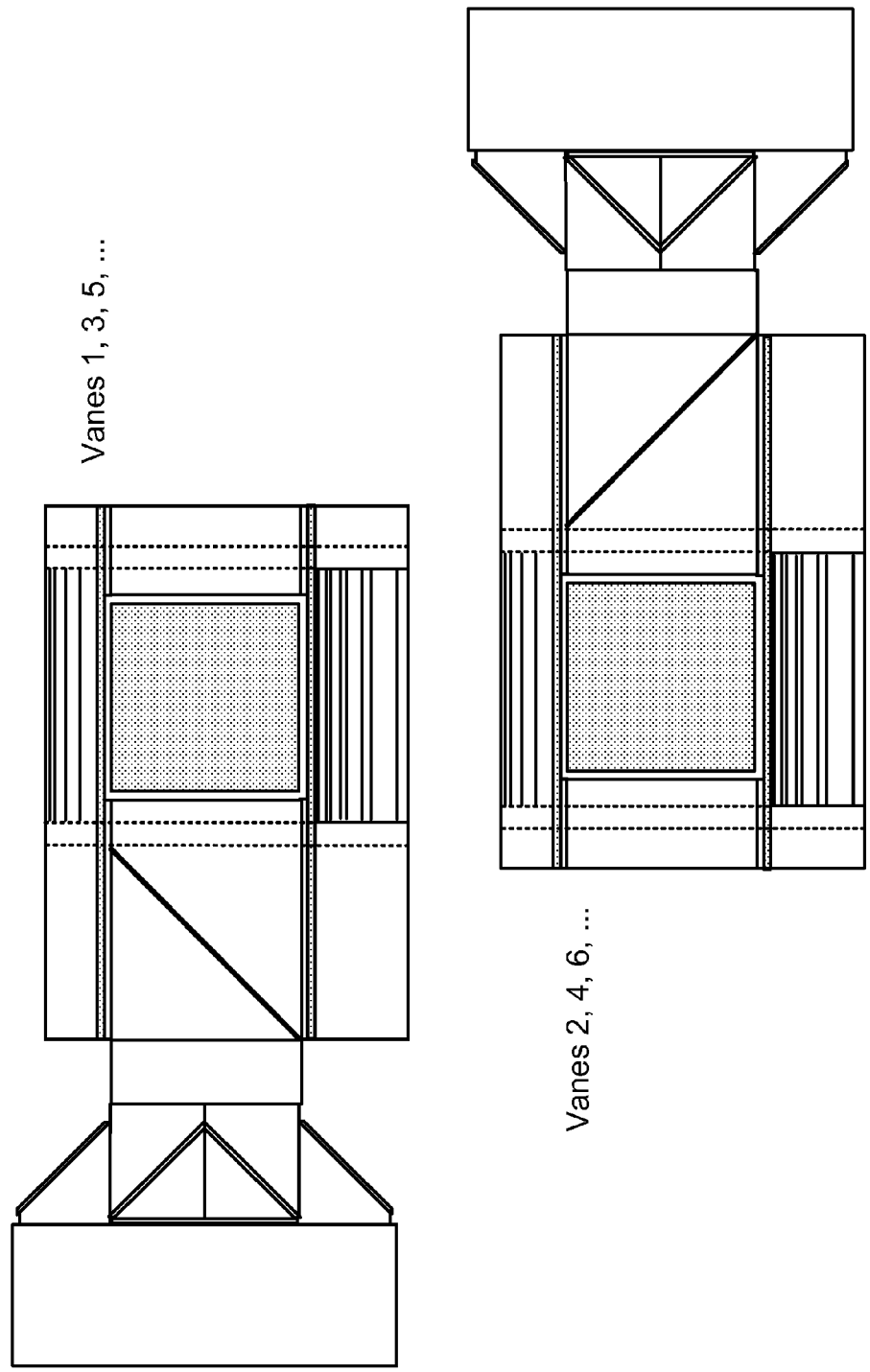
FIG. 6 is a simplified schematic diagram illustrating an alternating pump architecture according to an embodiment of the present invention.

FIG. 6 is a simplified schematic diagram illustrating an alternating pump architecture according to an embodiment of the present invention. As illustrated in FIG. 6, transverse pumped amplifier modules as discussed in relation to FIG. 3 are alternated along the gain path of the laser/amplifier system, thereby reducing non-uniformities in the effective gain profile. As illustrated in FIG. 6, odd numbered vanes are pumped from the left and even numbered vanes are pumped from the right. Other suitable configurations are also included within the scope of the present invention. Typically, amplifier slabs with a thickness in the propagation direction much less than the width and height of the slab are utilized. Thus, the modules illustrated in FIG. 6 are shown with the optical path of the amplified laser light normal to the plane of the figure.

Figure 7:
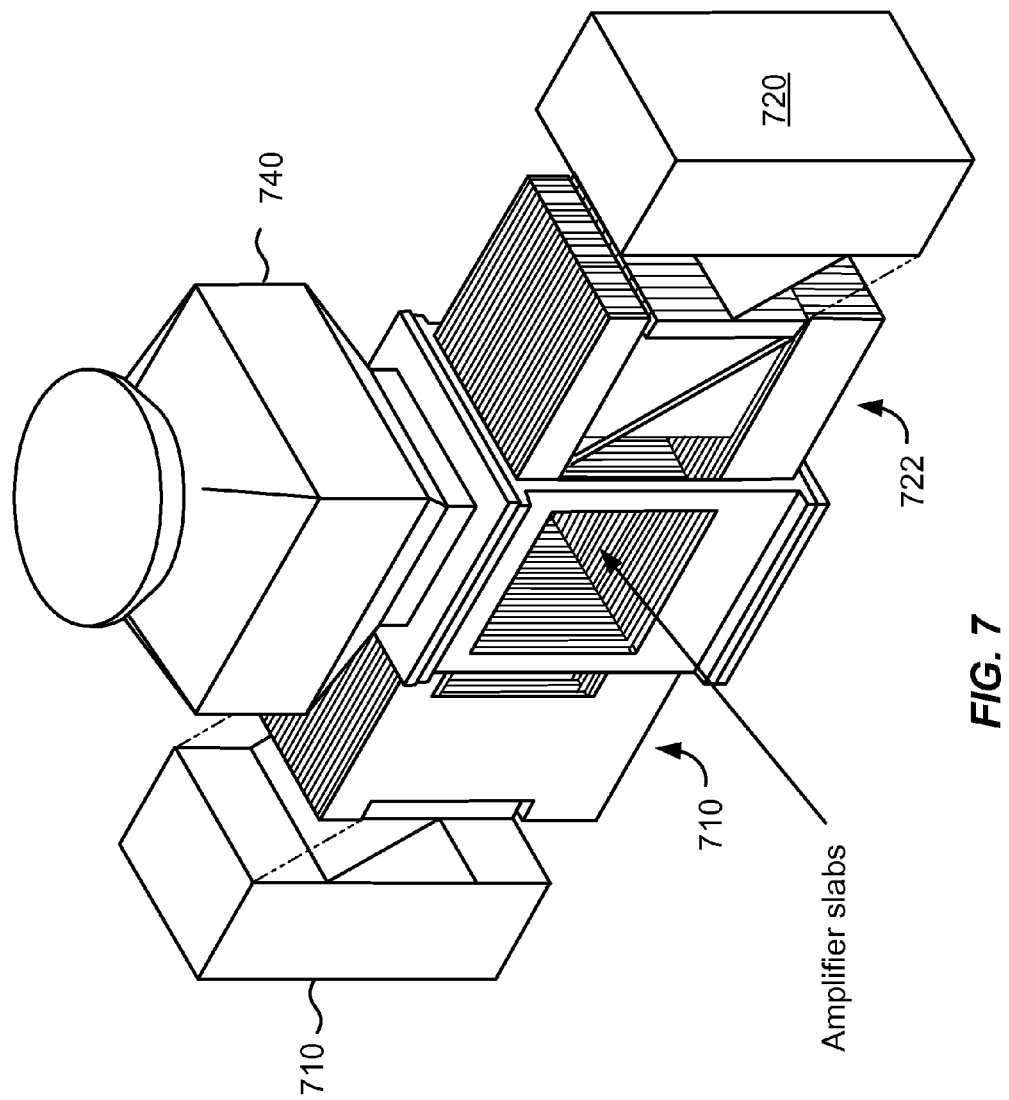
FIG. 7 is a simplified perspective view illustrating a transverse pumped optical amplifier architecture according to an embodiment of the present invention.

FIG. 7 is a simplified perspective view illustrating a transverse pumped optical amplifier architecture according to an embodiment of the present invention. This isometric view illustrates an amplifier column including semiconductor laser pump arrays, the pump light delivery system, and a helium intercooler. Referring to FIG. 7, a plurality of pump modules are interlaced with adjacent pump modules pumped from opposing sides. A first diode array 710 injects pump light into a first dichroic section 712 and a second diode array 720 injects pump light into a second dichroic section 722. As shown in FIG. 7, polarization combination is used to improve the pump light injection efficiency. Referring to second dichroic section 722, pump light passes through this section as it is waveguided toward the amplifier slabs. The region at which the two prism shaped optical elements are joined can be coated with a dichroic coating that transmits light (AR) at the pump wavelength and reflects light (HR) at the laser wavelength. The pump light enters the amplifier slabs 730 and can be reflected back toward the amplifier slabs by a second dichroic coating (not shown) that reflects light (HR) at the pump wavelength and transmits light (AR) at the laser wavelength. Therefore, waveguiding and ASE rejection are provided as discussed throughout the specification. Intercooler 740 is provided including a manifold that vents the cooling fluid (e.g., helium) past the amplifier slabs to cool them during operation.

For systems with end pumping designs, the pump light intensity falls as the pump light propagates through the set of amplifier slabs used in the amplifier system. As a result, the amplifier slabs have tailored doping concentration profiles as a function of position in the system, thereby requiring a large parts inventory. Embodiments of the present invention solve these inventory problems since the transverse pumping architecture enables each set of paired amplifiers to utilize the same design. For large, high average power systems, embodiments of the present invention thereby provide significant advantages from a inventory and supply perspective. In some embodiments, pumping is provided from multiple directions, for example, one or more of right/left as illustrated in FIG. 7, top/bottom in a similar manner, end pumping, and/or combinations thereof.

Figure 8:
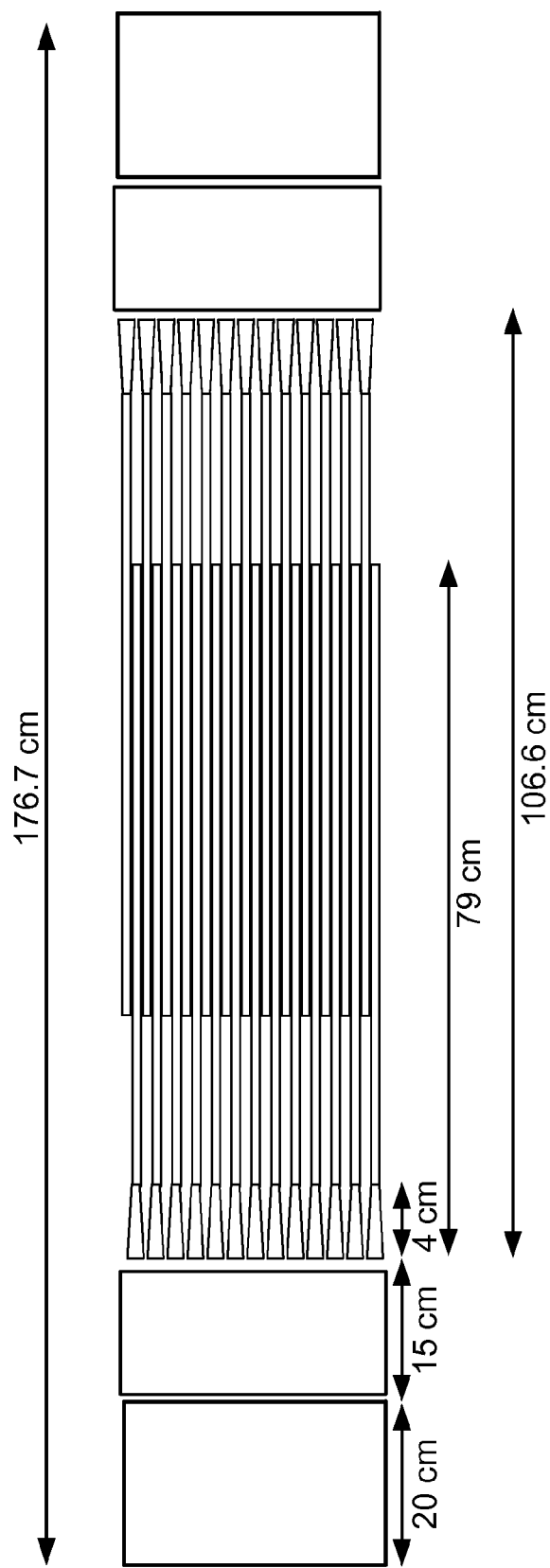
FIG. 8 is a simplified plan view illustrating a transverse pumped laser architecture according to an embodiment of the present invention.

FIG. 8 is a simplified plan view illustrating a transverse pumped laser architecture according to an embodiment of the present invention. As shown in FIG. 8, a view along a direction orthogonal to the direction of propagation of the amplified laser light is illustrated. Referring to FIG. 7, the view in FIG. 8 is taken looking down from the intercooler 740. Typical dimensions for the various components are given for an exemplary embodiment of 20 cm for the semiconductor laser pump arrays, 15 cm for the polarization combination section, 4 cm for the optical duct leading to the amplifier modules, 79 cm for the length of the amplifier module including the optical duct, and 106.6 cm for the length of the alternating sets of amplifier modules. In this exemplary embodiment, the total length of the system is 176.7 cm. The dimensions illustrated in FIG. 8 are merely provided by way of example and are not intended to limit the scope of the present invention. One of ordinary skill in the art would recognize many variations, modifications, and alternatives.

Figure 9:
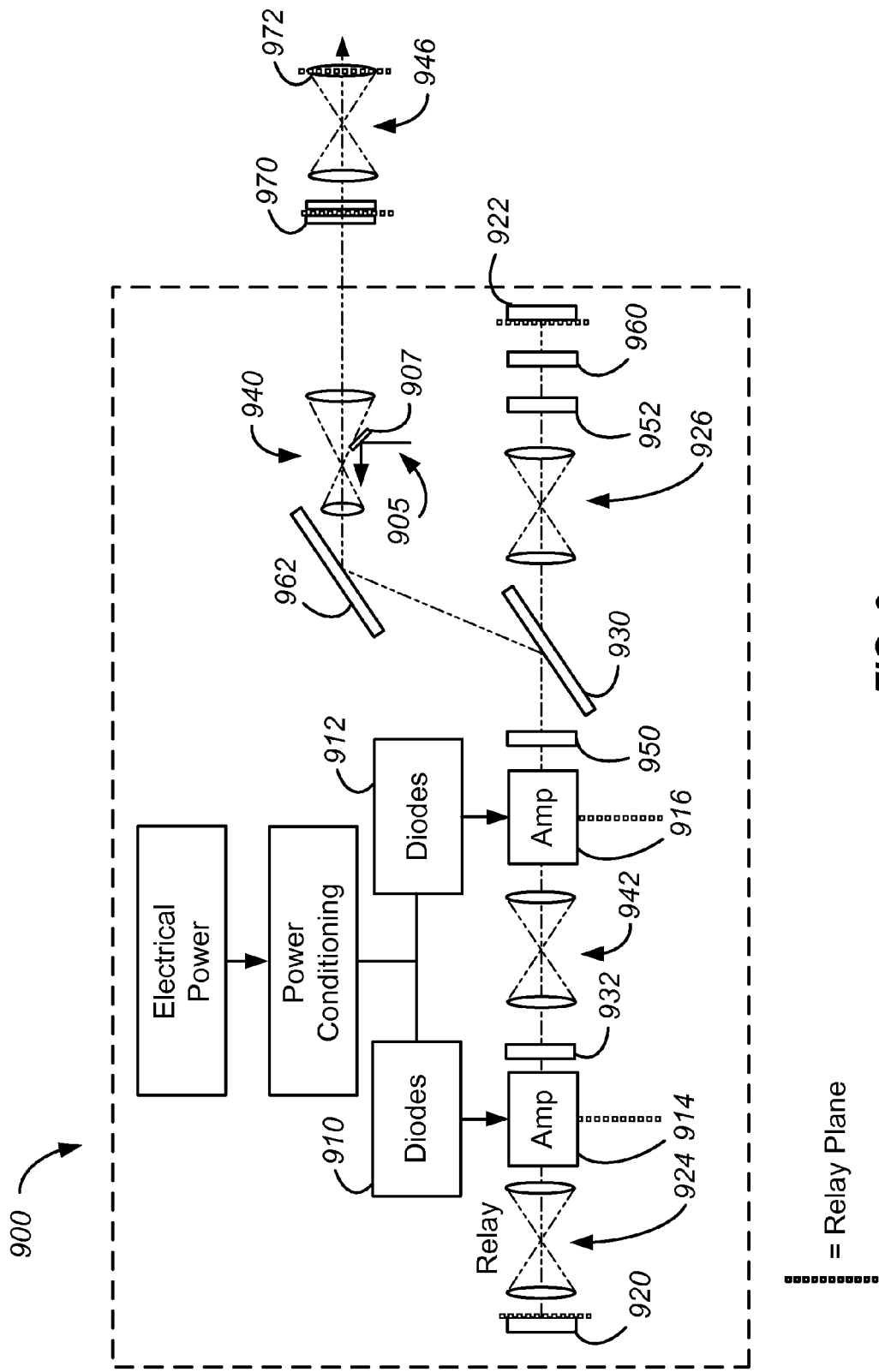
FIG. 9 is a laser amplifier system according to an embodiment of the present invention.

FIG. 9 is a laser amplifier system according to an embodiment of the present invention. The laser amplifier system 900 illustrated in FIG. 9 utilizes a dual amplifier architecture in a cavity utilizing image relaying to improve system efficiency. In input beam 905 is injected into the cavity using injection mirror 907. In an embodiment, the input beam is a laser pulse having an energy of 0.9 J. The input beam reflects off mirror 962. The polarization of the input beam is a predetermined polarization (e.g., s-polarization) so that the input beam reflects off of polarizer 930, which is aligned to reflect the polarization state of the input beam 905. The input beam passes through quarter-wave plate 950 and makes a first pass through amplifier 916 and amplifier 914. As will be evident to one of skill in the art, the amplifiers 916 and 914 can be a set of amplifier slabs as illustrated in FIGS. 7 and 8.

Disposed between amplifier 916 and amplifier 914 is a spatial filter 942 in the form of a telescope and a pinhole (not shown). Other spatial filters can be utilized according to embodiments of the present invention and the pinhole filter illustrated is merely provided by way of example. After the first amplification pass through amplifier 916, the beam passes through a quartz rotator 930 before the first amplification pass through amplifier 914. A relay telescope 924 is provided to relay the image formed at the center of amplifier 914 to a reflective surface of mirror 920. Image relaying is illustrated by the group of aligned squares illustrated at the center of amplifier 914 and the surface of mirror 920 as well as other locations in the system.

The amplified light is reflected from mirror 920, passes back through relay telescope 924, and makes a second pass through the set of amplifiers 914 and 916. After passing through the quartz rotator 932 and the quarter-wave plate 950 two times, the polarization of the amplified beam is rotated to enable the beam to pass through polarizer 930. The beam passes through relay telescope 926, a second quarter-wave plate 952, and a Pockels cell 960. Relay telescope 926 relays an image at the center of amplifier 916 to the reflective surface of mirror 922. The intensity of the amplified beam at the Pockels cell 960 is produced by two amplification passes through the set of amplifiers. Although the input beam may have passed through multiple amplifier slabs in each amplifier 914 and 916, the beam at Pockels cell 960 is referred to as a twice amplified beam. The Pockels cell is activated to rotate the polarization of the twice amplified beam so that it passes through polarizer 930. After two more passes through the amplifiers, the beam is reflected from polarizer 930 and mirror 962 towards the final optic 972. The beam, after four amplification passes, is transmitted through spatial filter 940 and frequency converter 970. Relay telescope 946 relays an image of the beam at the frequency converter 970 to the final optic 972. In some embodiments, a neutron pinhole is utilized to protect the amplifier system from neutrons emitted by fusion events.

Embodiments of the present invention provide a laser amplifier system 900 with an output energy of 6.3 kJ at 1ω and 3.5 kJ at 3ω. The system enables a 25 cm×25 cm hard aperture at the 1ω wavelength. Other embodiments provide different size apertures as appropriate to the particular application.

Figure 10:
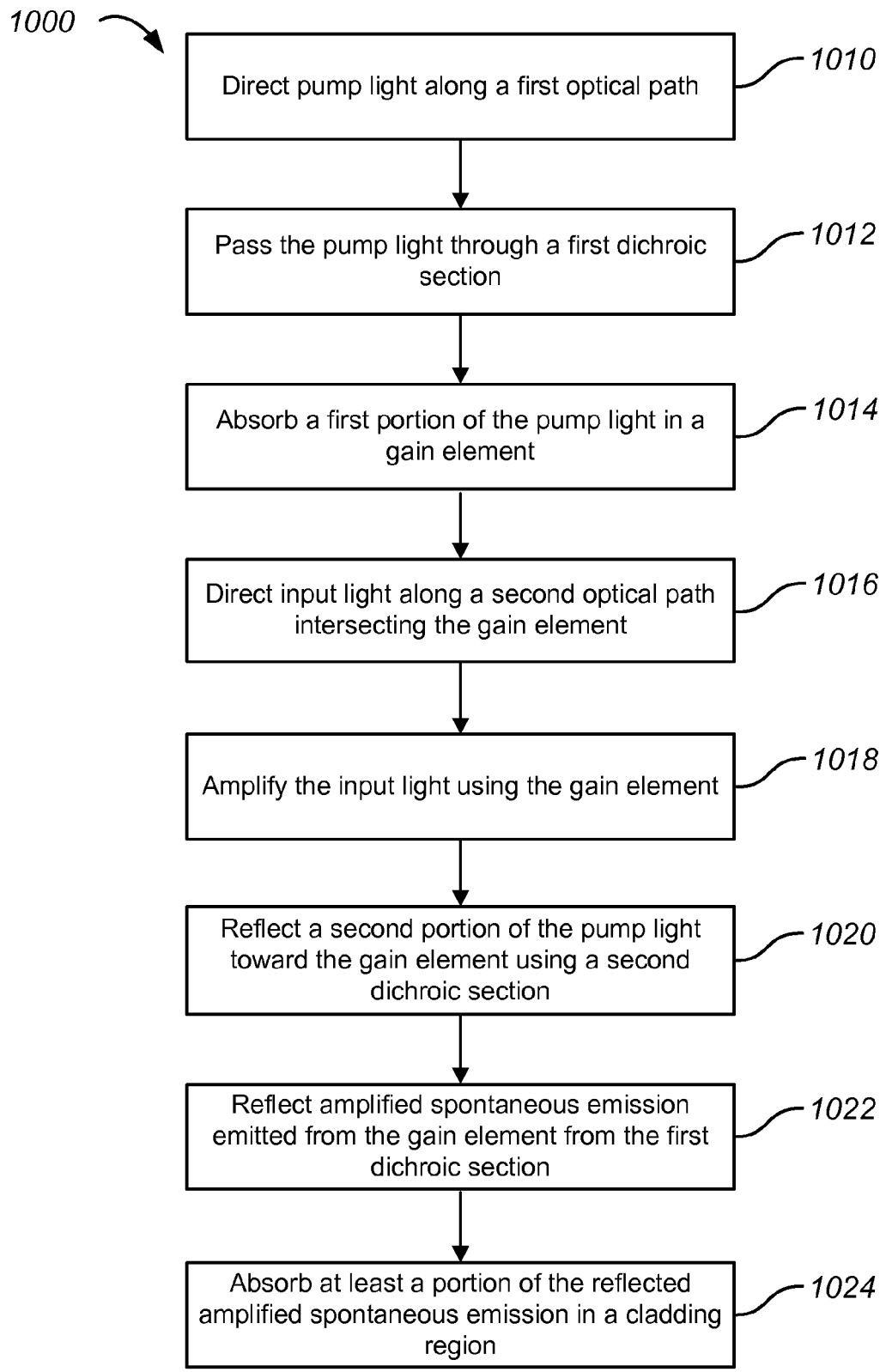
FIG. 10 is a simplified flowchart illustrating a method of operating an optical gain module according to an embodiment of the present invention.

FIG. 10 is a simplified flowchart illustrating a method of operating an optical gain module according to an embodiment of the present invention. The method 1000 includes directing pump light along a first optical path (1010) and passing the pump light through a first dichroic section (1012). The method also includes absorbing a first portion of the pump light in a gain element (1014), directing input light along a second optical path intersecting the gain element (1016), and amplifying the input light using the gain element (1018). In embodiments of the present invention, the gain element includes an amplifier slab. Referring to FIG. 7, the second optical path is substantially orthogonal to the first optical path. Thus, pumping is performed in a direction transverse to the extraction direction.

The method further includes reflecting a second portion of the pump light toward the gain element using a second dichroic section (1020), reflecting amplified spontaneous emission emitted from the gain element from the first dichroic section (1022), and absorbing at least a portion of the reflected amplified spontaneous emission in a cladding region (1024).

According to an embodiment, of the present invention, the pump light is passed through an optical duct prior to passing through the first dichroic section. As discussed above, the method may also include flowing a cooling gas in a region adjacent the gain element (e.g, an amplifier slab). The optical gain module can be integrated into a portion of a laser system or an optical amplifier of a laser amplifier system as illustrated in FIG. 9.

It should be appreciated that the specific steps illustrated in FIG. 10 provide a particular method of operating an optical gain module according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple substeps that may be performed in various sequences as appropriate to the individual step. Furthermore, additional steps may be added or removed depending on the particular applications. One of ordinary skill in the art would recognize many variations, modifications, and alternatives.

Figure 11A:
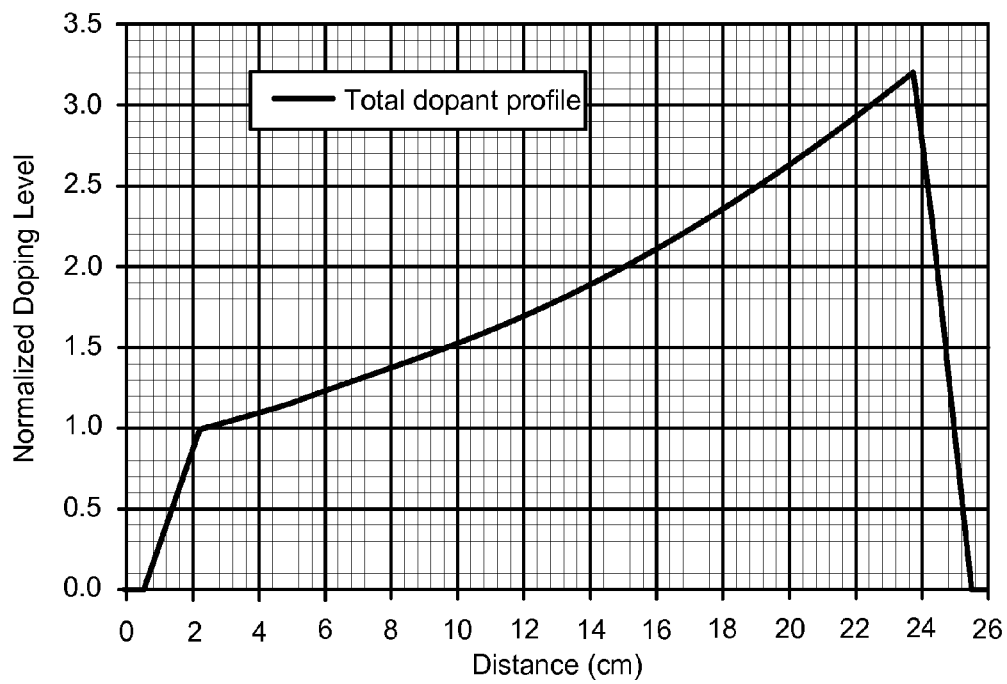
FIG. 11A is a simplified plot illustrating doping level as a function of distance according to an embodiment of the present invention.

FIG. 11A is a simplified plot illustrating doping level as a function of distance according to an embodiment of the present invention. As an example, the dopant profile could be approximated as equal to $\exp(\alpha_{gr}*x)$, where $\alpha_{gr}$ is the dopant gradient coefficient (e.g., 0.054 cm$^{-1}$) and x is the distance extending into the gain slab in centimeters.

Figure 11B:
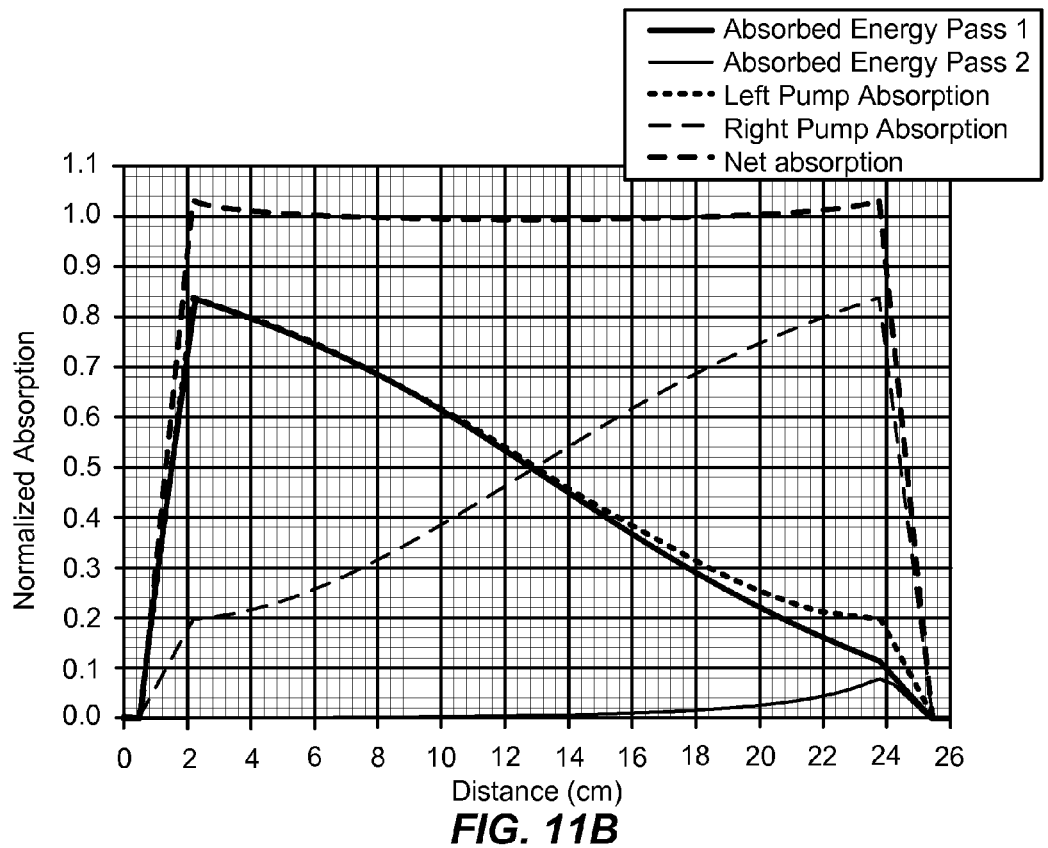
FIG. 11B is a simplified plot illustrating pump absorption profiles as a function of distance associated with the doping levels illustrated in FIG. 11A.

FIG. 11B is a simplified plot illustrating pump absorption profiles as a function of distance associated with the doping levels illustrated in FIG. 11A. In the plot illustrated in FIG. 11B, the dopant profile results in a slightly concave gain profile. The absorption efficiency illustrated in FIG. 11B is 0.999.

Figure 12A:
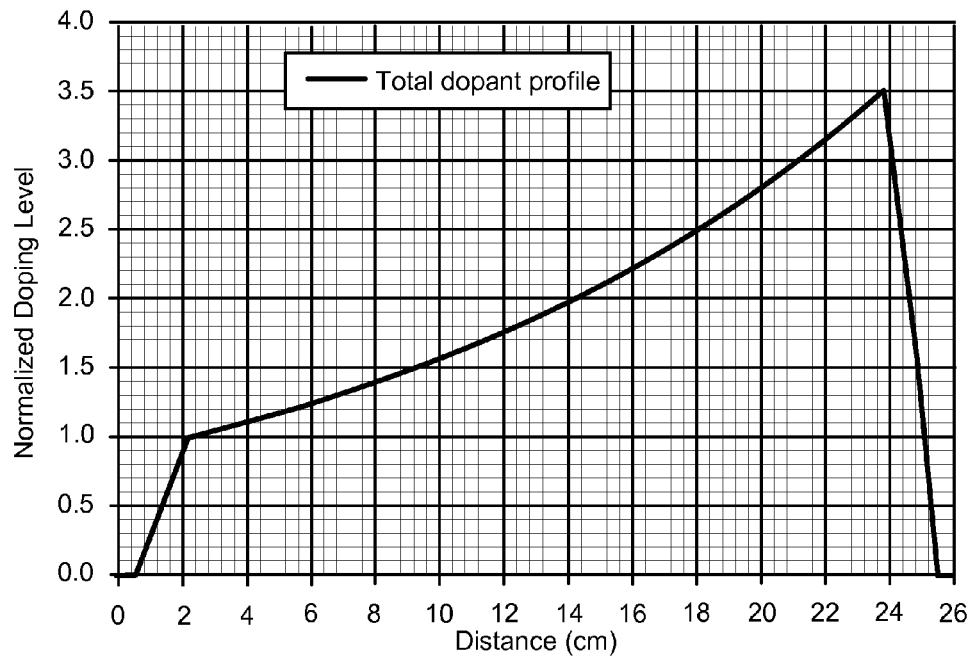
FIG. 12A is a simplified plot illustrating doping level as a function of distance according to another embodiment of the present invention.

FIG. 12A is a simplified plot illustrating doping level as a function of distance according to another embodiment of the present invention. As an example, the dopant profile could be approximated as equal to $\exp(\alpha_{gr}*x)$, where $\alpha_{gr}$ is the dopant gradient coefficient (e.g., 0.058 cm$^{-1}$) and x is the distance extending into the gain slab in centimeters.

Figure 12B:
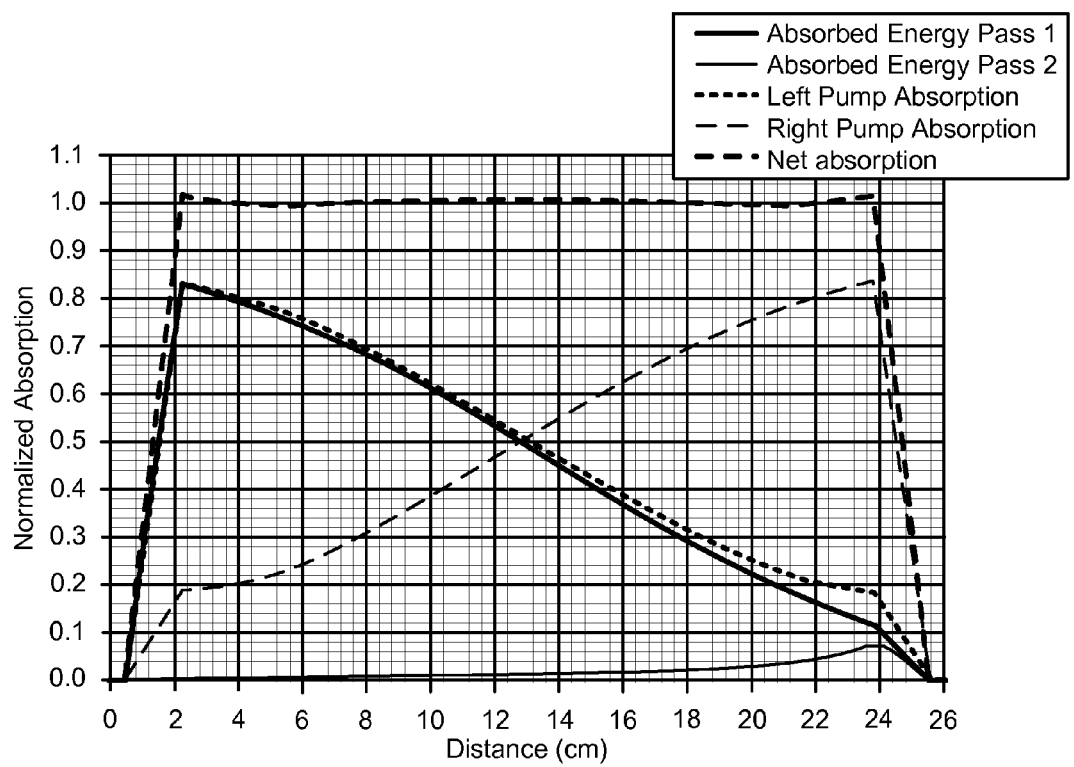
FIG. 12B is a simplified plot illustrating pump absorption profiles as a function of distance associated with the doping levels illustrated in FIG. 12A.

FIG. 12B is a simplified plot illustrating pump absorption profiles as a function of distance associated with the doping levels illustrated in FIG. 12A. In the plot illustrated in FIG. 12B, the dopant profile results in a nearly flat gain profile. The absorption efficiency illustrated in FIG. 11B is 0.999.

Figure 13A:
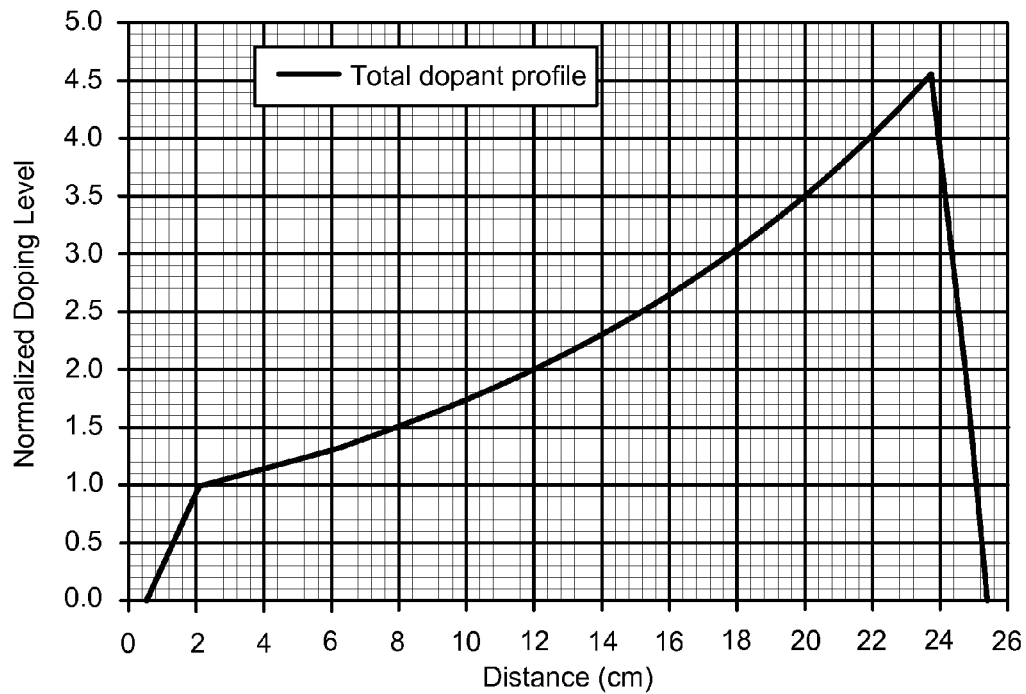
FIG. 13A is a simplified plot illustrating doping level as a function of distance according to yet another embodiment of the present invention.

FIG. 13A is a simplified plot illustrating doping level as a function of distance according to yet another embodiment of the present invention. As an example, the dopant profile could be approximated as equal to $\exp(\alpha_{gr}*x)$, where $\alpha_{gr}$ is the dopant gradient coefficient (e.g., 0.07 cm$^{-1}$) and x is the distance extending into the gain slab in centimeters.

Figure 13B:
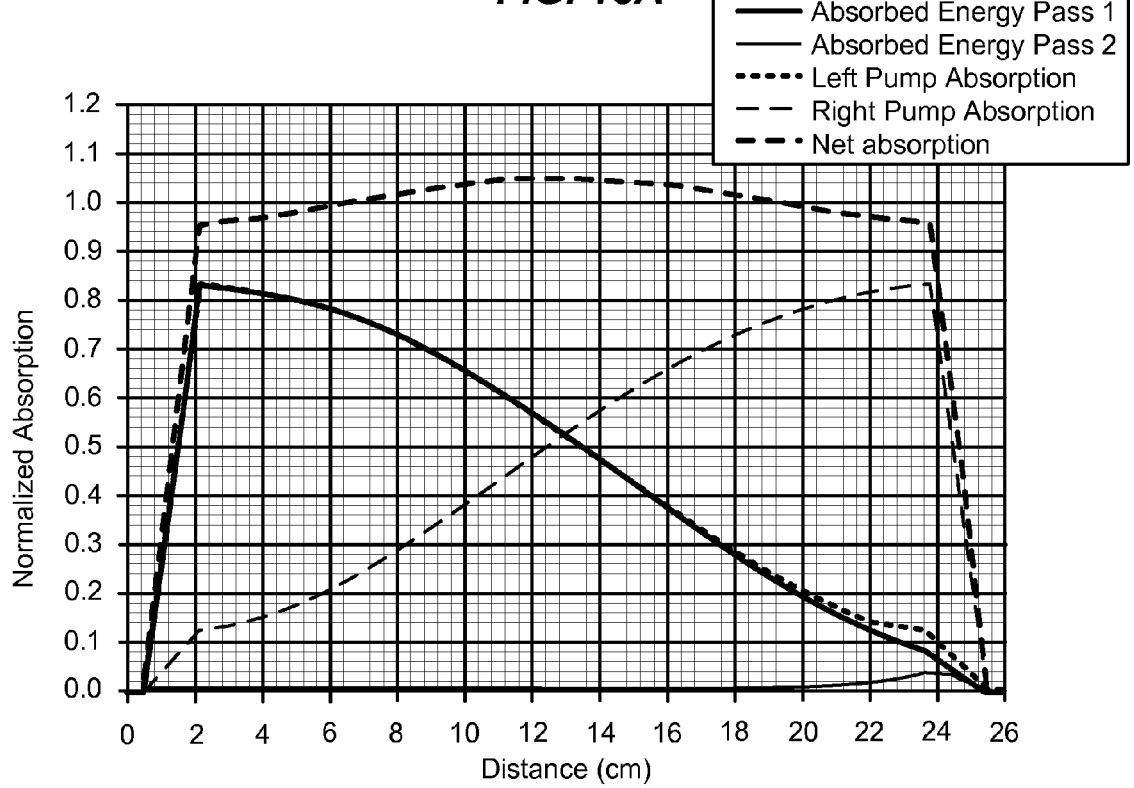
FIG. 13B is a simplified plot illustrating pump absorption profiles as a function of distance associated with the doping levels illustrated in FIG. 13A.

FIG. 13B is a simplified plot illustrating pump absorption profiles as a function of distance associated with the doping levels illustrated in FIG. 13A. In the plot illustrated in FIG. 13B, the dopant profile results in a slightly convex gain profile. The absorption efficiency illustrated in FIG. 11B is 1.000.

Figure 14A:
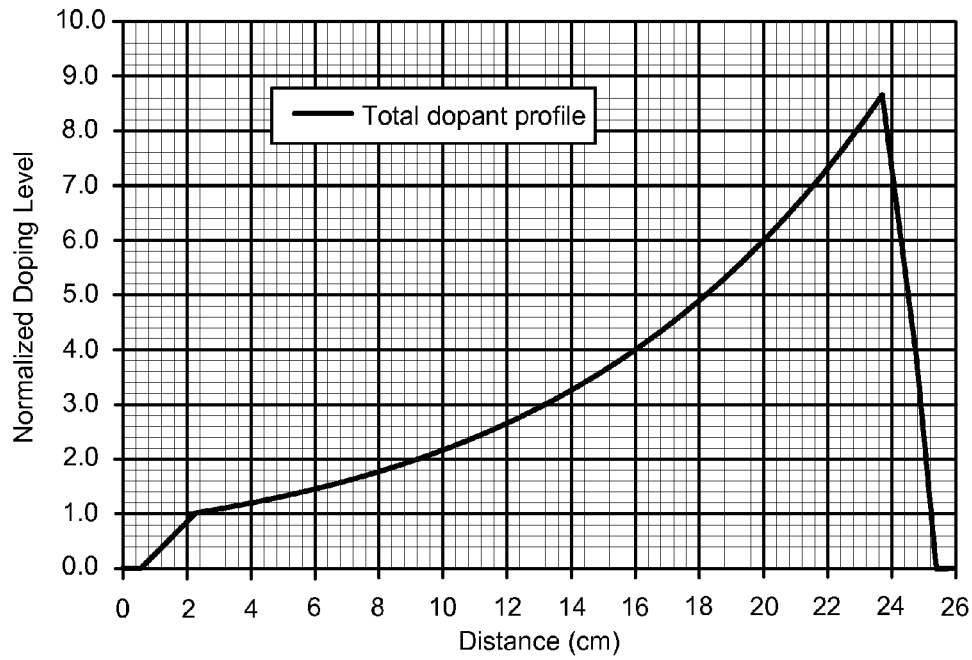
FIG. 14A is a simplified plot illustrating doping level as a function of distance according to a specific embodiment of the present invention.

FIG. 14A is a simplified plot illustrating doping level as a function of distance according to a specific embodiment of the present invention. As an example, the dopant profile could be approximated as equal to $\exp(\alpha_{gr}*x)$, where $\alpha_{gr}$ is the dopant gradient coefficient (e.g., 0.1 cm$^{-1}$) and x is the distance extending into the gain slab in centimeters.

Figure 14B:
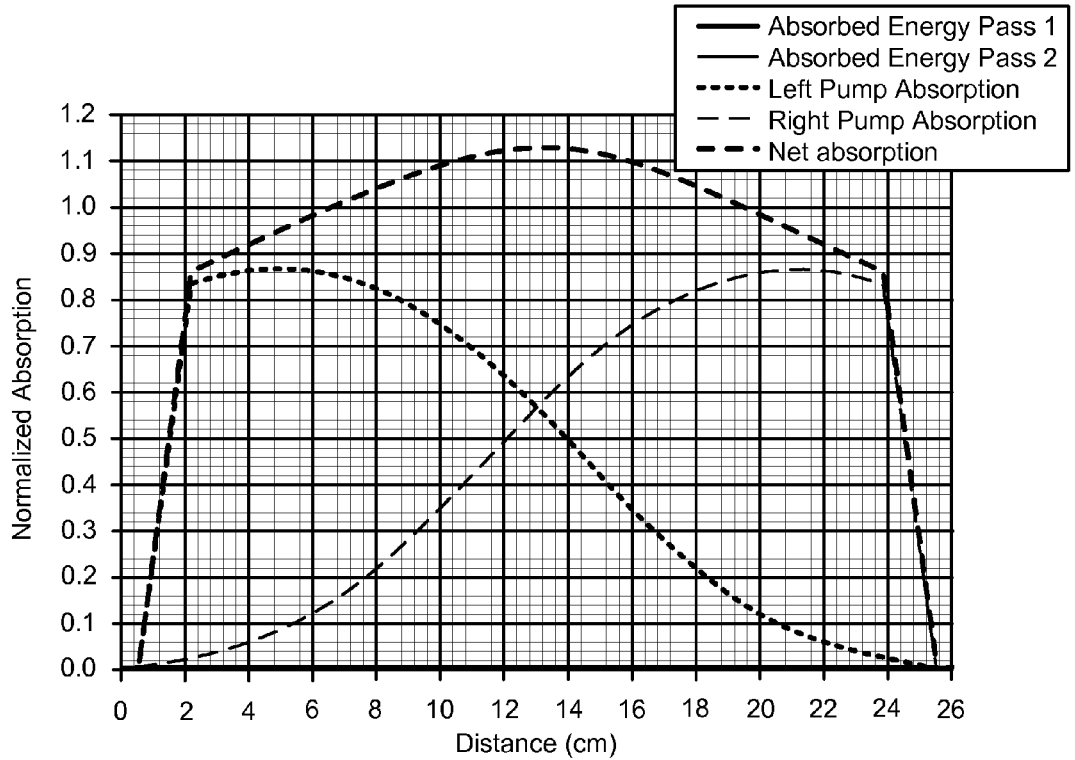
FIG. 14B is a simplified plot illustrating pump absorption profiles as a function of distance associated with the doping levels illustrated in FIG. 14A.

FIG. 14B is a simplified plot illustrating pump absorption profiles as a function of distance associated with the doping levels illustrated in FIG. 14A. In the plot illustrated in FIG. 14B, the dopant profile results in a very convex gain profile. The absorption efficiency illustrated in FIG. 11B is 1.000.

The dopant profiles illustrated in FIGS. 11A-14A and the resulting absorption profiles illustrated in FIGS. 11B-14B are merely examples and are not intended to limit the scope of the present invention. Other dopant profiles are included within the scope of the present invention.

According to embodiments of the present invention, wedged amplifiers may be used to compensate for the absorption efficiency less than unity that is associated with, for example, homogeneously doped slabs and the absorption profile illustrated in FIG. 4A. The wedged amplifiers can also flatten the overall absorption profile in comparison with the one illustrated in FIG. 4A.

Figure 15A:
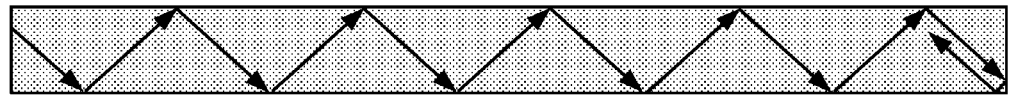
FIG. 15A is a simplified schematic diagram of an amplifier slab with parallel faces.

FIG. 15A is a simplified schematic diagram of an amplifier slab with parallel faces. The ray path across the uniform slab is illustrated in FIG. 15A and about 11 reflections from the surfaces of the slab occur as the ray propagates through the slab.

Figure 15B:
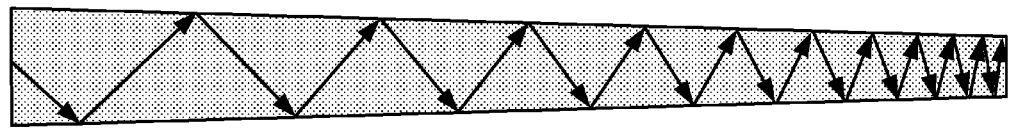
FIG. 15B is a simplified schematic diagram illustrating an amplifier slab with wedged faces.

FIG. 15B is a simplified schematic diagram illustrating an amplifier slab with wedged faces. As illustrated in FIG. 15B, the same ray traveling across a wedged slab with wedged faces has about 22 reflections and about 1.5 times the path length in comparison with the uniform slab. Thus, as illustrated in FIG. 15B, the ray makes successively more bounces with increasing distance along the transverse direction, which increases the effective absorption as a function of transverse distance. Thus, embodiments utilizing wedged slabs provide a functionality similar to increasing the doping as a function of transverse distance using a uniform slab for which the faces are parallel.

It should be noted that if the gain profile is flat and the cooling originates from the surfaces of the wedged slab, then the thermal profile will typically be wedged, with the hotter side being associated with the thicker portion of the slab as a result of the thermal conductivity of the wedged slab. Additionally, the use of wedged slabs can result in relatively large wedge angles, which may present issues related to maintenance of total internal reflection (TIR). As illustrated in FIG. 15B, injection of the rays into glass at the TIR angle an increase in path length of about 1.5 times is achieved. As the rays are injected along a direction that is closer to parallel to the slab faces, the increase in path length is reduced. The angle of incidence on the surface of the wedged slab steadily increases as a function of transverse distance, but the reflectivity of the surface will drop off as the angle approaches normal, notably when the angle falls below the TIR critical angle.

Figure 16:
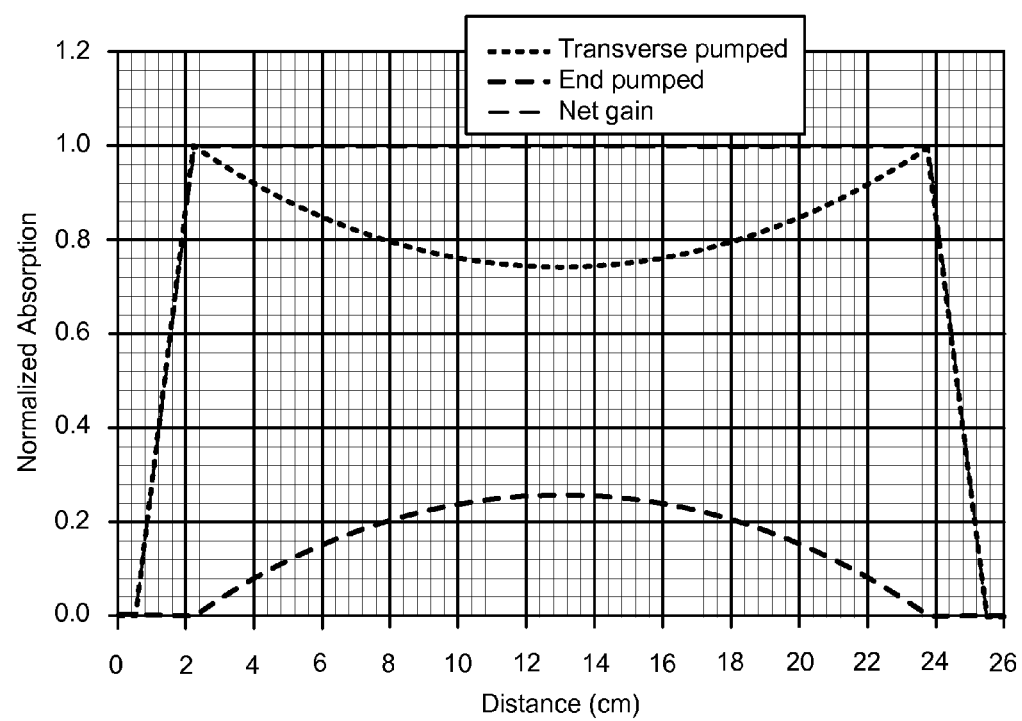
FIG. 16 is a simplified plot illustrating pump absorption profiles as a function of distance according to a particular embodiment of the present invention.

FIG. 16 is a simplified plot illustrating pump absorption profiles as a function of distance according to a particular embodiment of the present invention. As illustrated in FIG. 16, a normalized absorption profile with a flat gain profile is illustrated. This gain profile results from transverse pumping of a uniform slab with parallel faces and a homogeneous doping profile with the addition of a spatially sculpted end pump profile. Thus, end or face pumping of the amplifier slabs may be combined with transverse pumping to reduce the variations in the spatial gain profile as a function of distance. It should be noted that achieving the absorption profile illustrated in FIG. 16 may utilize full size pump optics for each pumping scheme. Additionally, creation of the parabolic pump profile shape illustrated in FIG. 16 may include the use of specialized irradiance conditioning on the diode arrays or other laser used for end pumping.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An optical gain architecture comprising:
   a pump source operable to produce light at a pump wavelength along an optical path; a pump aperture operable to receive the light at the pump wavelength;
   a gain region disposed along the optical path and including a gain element operable to amplify light at a laser wavelength, wherein the gain region is characterized by a first side intersecting the optical path, a second side opposing the first side, a third side adjacent the first and second sides, and a fourth side opposing the third side;
   a dichroic section disposed between the pump aperture and the first side of the gain region, wherein the dichroic section is characterized by low reflectance at the pump wavelength and high reflectance at the laser wavelength;
   a first cladding section proximate to the third side of the gain region;
   a second cladding section proximate to the fourth side of the gain region;
   a second dichroic section disposed along the optical path proximate to the second side of the gain region, wherein the second dichroic section is characterized by a high reflectance at the pump wavelength and a low reflectance at the laser wavelength; and a third cladding section proximate to the second dichroic section.

2. The architecture of claim 1 wherein the second dichroic section comprises a dichroic coating.

3. The architecture of claim 1 wherein the pump source comprises an array of semiconductor lasers.

4. The architecture of claim 1 wherein the dichroic section comprises a set of prisms and a dichroic coating.

5. The architecture of claim 4 wherein the dichroic coating is disposed at about 45° to the optical path.

6. The architecture of claim 1 wherein the first cladding section and the second cladding section are operable to absorb light at the laser wavelength.

7. The architecture of claim 1 further comprising an optical duct disposed between the pump source and the dichroic section.

8. The architecture of claim 1 wherein the gain element comprises an amplifier slab.

9. The architecture of claim 1 further comprising at least one of a polarization combiner or a spectral combiner.

* * * * *